United States Patent [19]

Turai

[11] Patent Number: 4,908,622
[45] Date of Patent: Mar. 13, 1990

[54] PROCESS AND CIRCUIT FOR SAMPLING ACCORDING TO INSTANTANEOUS SIGNAL VALUE, INDEPENDENT FROM THE FREQUENCY RANGE OF THE SIGNAL TO BE RECORDED

[75] Inventor: Endre Turai, Miskolc, Hungary

[73] Assignee: Nehezipari Muszaki Egyetem, Miskolc, Hungary

[21] Appl. No.: 146,131

[22] Filed: Jan. 20, 1988

Related U.S. Application Data

[63] Continuation-in part of Ser. No. 713,384, filed as PCT HU84/00038 on Jun. 3, 1984, published as WO85/00257 on Jan. 17, 1985, abandoned.

[30] Foreign Application Priority Data

Jun. 20, 1983 [HU] Hungary ............................ 2187/83

[51] Int. Cl.$^4$ ............................................. H03M 1/14
[52] U.S. Cl. ................................... 341/122; 364/487; 341/123
[58] Field of Search ...................... 324/77 A; 364/487; 341/123, 124, 125, 122; 307/351, 352

[56] References Cited

U.S. PATENT DOCUMENTS

| | | | |
|---|---|---|---|
| 4,132,947 | 1/1979 | Weischedel et al. | 324/77 A |
| 4,142,146 | 2/1979 | Schumann et al. | 324/77 A |
| 4,291,299 | 9/1981 | Hinz et al. | 341/123 |
| 4,297,680 | 10/1981 | Koeman | 341/123 |

Primary Examiner—William M. Shoop, Jr.
Assistant Examiner—Gary J. Romano
Attorney, Agent, or Firm—Young & Thompson

[57] ABSTRACT

An unknown signal is sampled by simultaneously comparing its value with that of each of a plurality of predetermined monitoring levels. An independent time variable is recorded that represents the instant when the signal has a value equal to that of a given monitoring level. Equality of the signal value to that of a given level is detected regardless of whether the signal has increased or decreased to that value. The values of the monitoring levels are changed automatically whenever the signal has a value greater than the highest value monitoring level or less than the lowest value monitoring level. Signal sections having infinitely high rates of change over time may thus be accurately sampled and reconstructed.

7 Claims, 17 Drawing Sheets

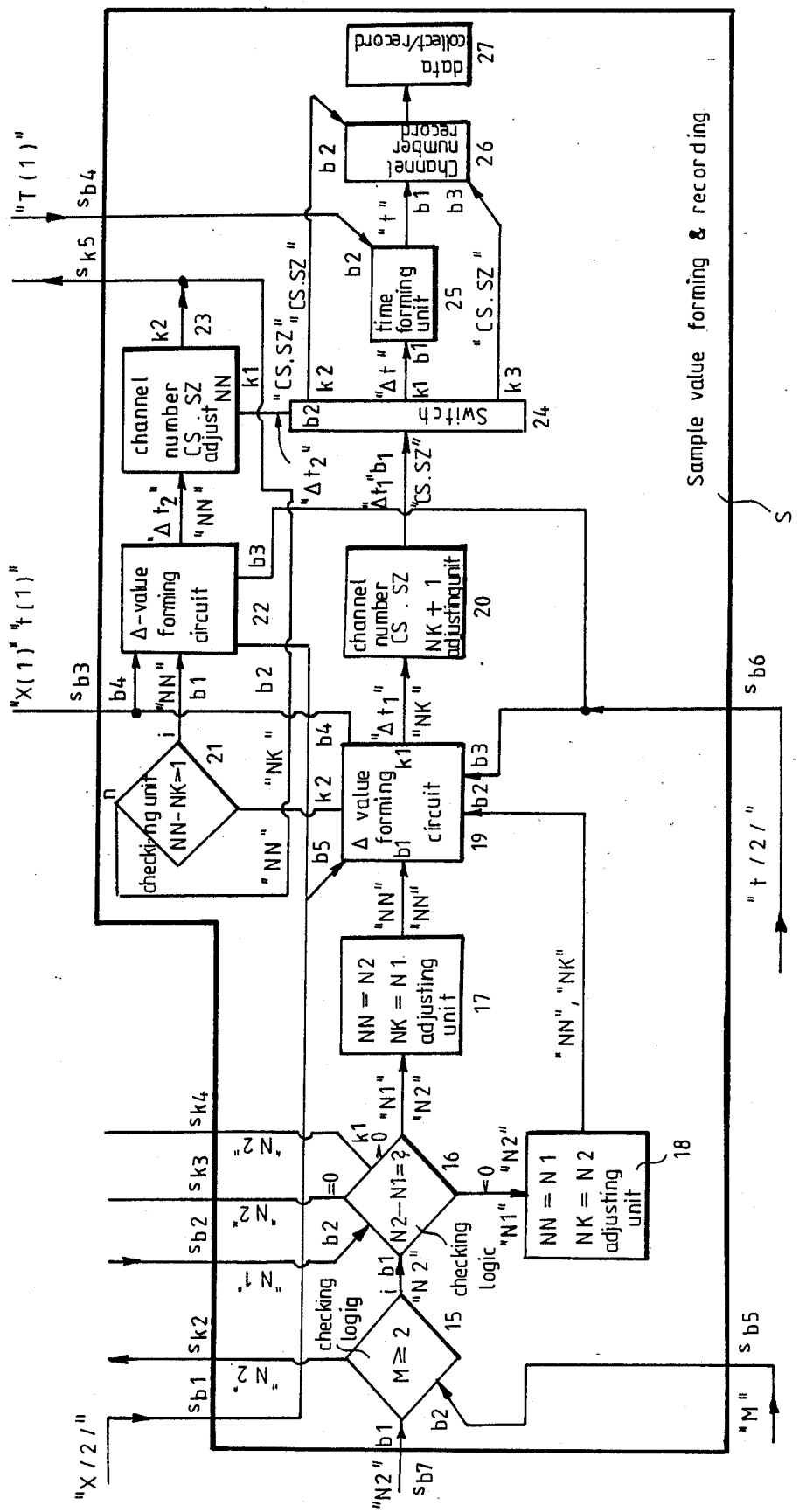
Fig. 5.b

Fig. 13a
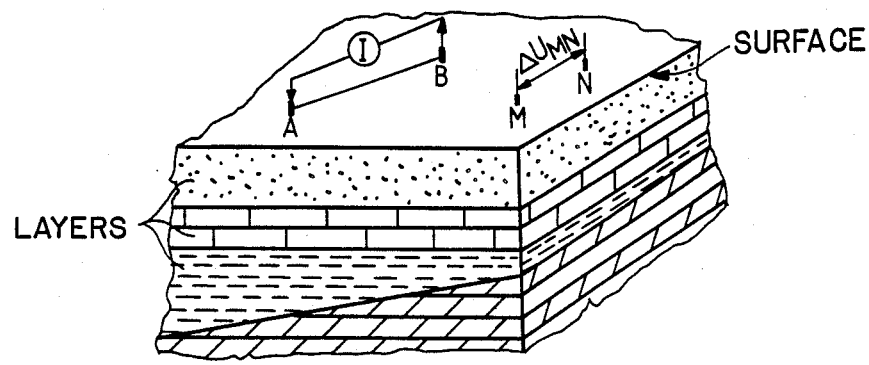
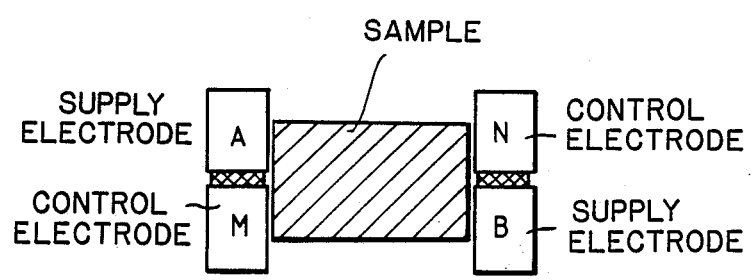
Fig. 13b

PROCESS AND CIRCUIT FOR SAMPLING ACCORDING TO INSTANTANEOUS SIGNAL VALUE, INDEPENDENT FROM THE FREQUENCY RANGE OF THE SIGNAL TO BE RECORDED

This application is a continuation-in-part of my co-pending application Ser. No. 713,384 filed Feb. 20, pending application Ser. No. 713,384 filed as PCT HU84/00038 on Jun. 3, 1984, published as WO85/000257 on Jan. 17, 1985, now abandoned.

BACKGROUND OF THE INVENTION

1. Field of the Invention

The invention relates to a sampling method for sampling signals according to their magnitude but independently of their frequency range, thereby providing more accurate sampling or, from less frequently taken samples, identical quality sampling. Circuitry for accomplishing this method is also disclosed.

2. Description of the Prior Art

Sampling methods of several kinds and several circuit arrangements for the realization of these methods are known from literature and practice.

Essentially, sampling methods are divided in three groups by Alfred I. Monroe (*Digital Processes for Sampled Data Systems*, John Wiley and Sons, Inc., New York, 1962) and Frigyes Csáki (*Regulation Dynamics*, Akadémiai Kiadó, Budapest, 1970).

The most frequently used subgroup of fixed sequence linear sampling is known as simple (or common) sampling. Samples are taken at very short, constant intervals. Hence, the series of samples may be considered as a series of pulses. This method is described in detail in Chapter 15.5 ("Sampling Systems") of the book by Francis H. Raven, *Automatic Regulation* (Muszaki konyvkiadó, Budapest, 1965).

In Hungarian patent specification No. 168/55 a method is described for the measurement and recording of periodically sampled, rapidly changing cyclical signals. This method offers the possibility of measuring all required samples from a minimum number of cycles by taking the samples in the most expedient order of sequence and reestablishing their original sequence for the purpose of storage. According to this method, samples are taken at every n-th place of the identifying signal sequence and the number of the identifying signal sequence selecting the number of the sampling signal chosen from these, so as to make the two numbers contain different prime factors only. Then the samples thus measured are stored in the memory of address $m_i$ corresponding to the serial number of the identifying signal sequence. The voltage U to be measured is connected to the input of an A/D converter. The identifying pulses are led to the other input of the A/D converter through a pulse division circuit. After zeroing, the pulse division circuit issues a pulse to start a sampling under the effect of the first and all subsequent p-th pulses. Under the effect of each such pulse a pulse sequence proportional to the instantaneous value of voltage U is transferred from the A/D converter (instantaneous value meter) to the counter. At the end of conversion, under the effect of the pulse taken from the A/D converter the content of the counter is discharged into the register located at the first memory address. After the storage cycle the address register of the memory is shifted by a shift pulse by p steps, said shifting pulse being issued responsive to a voltage pulse by a second counter with the help of a clock generator. The address shifting pulses are counted by means of a cycle counter. When the number of address shift pulses reaches that of the identification signal sequence, a voltage signal is issued by the cycle counter to cause zeroing of the address register and itself, so that the address register is stepped forward from its zeroed state by means of the pulses left over from those of number p.

Also based on a sampling method of equal time intervals is the electronic circuit described in another Hungarian patent specification, No. 174,408, devised for amplification of analog sample signals with coefficients assuming discrete values.

Sometimes displaced (delayed or accelerated) sampling is used. In such cases, input and output signals are sampled at equal intervals t, but displaced by an interval T with respect to each other. This method is adapted mainly to multivariable time-sharing samplings. When sampling takes place cyclically at variable intervals the sampling interval varies cyclically, e.g. sinusoidally.

In the case of aperiodic sampling the sampling interval varies, but this variation is not cyclical. For example, with intermittent aperiodic sampling samples are taken at intervals T, but not at every such interval.

With slowly changing aperiodic sampling the interval between successive samplings varies, but only slightly.

With sampling taken at intervals changing after certain periods the interval T changes, but remains constant within said periods.

To the other subgroup belongs linear sampling of finite duration. Instantaneous taking of the samples is an approximation only; in reality, the samples are taken during a finite duration. Such a linear sampling of finite duration is realized by the circuit arrangement described in Hungarian patent specification No. 176,618 for the sampling of analog signals.

The other group of sampling is non-linear sampling. If changing of the sampling process does not take place according to a predetermined rule, but depends on the magnitude of the signal, the sampling is classified as non-linear. In Hungarian patent specification No. 172,590 an adaptive sampling circuit arrangement is described. Such adaptive sampling can be adapted to all cases where samples are to be taken from analog signals. Two wide fields of application are represented by the sampling (computer-based) regulation and telecommunication signal transmission. The method consists essentially of taking a new sample from analog signals to be transmitted only when the state of signals (or system, e.g. regulation) exhibits a definite change with respect to the value obtained by the preceding sample.

From the sampling criteria certain sampling laws can be deduced. These laws are mathematical formulae, from which the approximate duration of the sampling interval can be directly found, using the values obtained from the last sampling. In this way the lengths $T_i$ of the sampling intervals can be determined from the sampling criteria only if approximate assumptions are made as to how the signal (system) will vary, and the convention stated in criterion is satisfied only approximately. Additionally, a digital computer is required for evaluation of the formula obtained for the lengths of the sampling interval since discrete signal values have to be processed.

From the sampling criteria given in the mathematical formulae of the above patent specification, the lengths of sampling intervals are obtained by extrapolating the values of the last few sampled signals. This is a means through which the time of the next sampling can be assessed by means of discrete signal processing (e.g. with the use of a microprocessor). In the adaptive circuit arrangement proposed by the above-mentioned specification in the sequence of signal transmission, a difference amplifier, an absolute value former, an integrator, a comparator and a two-input OR-gate are connected in series. To one input of the difference amplifier are connected the input of the samples and self-reading circuit, to its other input the samples and self-sealing circuit or some other signal sources proportional to the latter are connected, whereas the output of pulse shaping circuit is led to the timing circuit causing the initial zero setting of the integrator to switch over into its other state after the elapse of a definite time, and the output of the reference-signal generator in the case of obtaining from the comparator a reference signal varying as a function of time producing a suitable reference signal is coupled to the reference input of the comparator, whereas the output of the timing circuit is linked up with one of the inputs of the OR-gate.

The third group of sampling is the semi-random, so-called Monte Carlo method, consisting of taking at random samples of discrete signal values. This method is suitable for recording statistical data occurring at random steady-state intervals, such as signals.

With the equal-interval sampling, about 99% of the time the signal components exceeding the Nyquist frequency do not pass by the sampling circuit and the components are recorded with different errors depending on their frequency. With signals of wide frequency spectra the number of samples taken will be lower than necessary in the upper range of frequencies but higher than necessary in the lower ranges. Owing to the frequency limitations, this kind of sampling is incapable of transmitting sections of signals where the rate of rise exceeds the maximum steepness determined by the sampling interval T.

Samplings taken at varying intervals can only partly overcome the above disadvantages, and offer no satisfactory solution in general. Frequency limitation is also imposed here, and the criterion of optimization cannot be satisfied. Sampling of an arbitrary signal, unknown in advance, thus cannot reliably be recorded.

These sampling methods can effectively be performed only in cases where the laws defining the signal shape are known in advance.

In the case of processes of wide frequency ranges and lasting much longer than the cycle time of the highest frequency component, such sampling methods may result in a very high number of superfluous samplings.

Although this effect is considerably reduced by the linear adaptive sampling mentioned above, this method still has the drawback of requiring the performance of additional calculations for determining the time of the next sampling, based on using the value of preceding samplings. The sampled value and also the time of sampling has to be determined and stored. A further considerable problem consists of requiring separate circuit arrangements for satisfying each item of the various criteria, as well as the inability of these circuits to transmit signal sections having rates of rise which exceed a certain steepness, or to recognize vertical or near-vertical signal sections. RAndom sampling is similarly unsuited for safely taking samples, since this method lends itself only to recording statistical characteristics of processes of a steady-state nature in time with relatively fair accuracy, but it does not permit true-to-form recording of the signal. Moreover, it may decisively distort the deterministic signal portions.

An attempt to eliminate the drawbacks of sampling methods widely used in practice has been made by HINZ in U.S. Pat. No. 4,291,299, in which a sampling system (A/D converter) is specified representing an intermediate technology between the methods of adaptive sampling and sampling according to the value of samples.

The above system essentially consists of leading the sampled signal, on the one hand, to a conventional sampling (sample and hold) circuit by which at each instant of sampling to be recorded a sample is taken from the signal and stored until a new sample is taken for storage. On the other hand, the sampled signal is fed into a so-called first comparator chain the comparators of which indicate when a preset voltage level is reached by the signal. Additionally, a difference-forming unit determines the difference between the instantaneous value of the input signal and the value of the signal at the instant of the preceding sampling (stored by the sample-and-hold circuit), and this difference is led to a so-called second chain of comparators, which indicates the time when the value of the signal changes to assume a predetermined value.

As a result of this method, sampling is effected at the time differences elapsing between consecutive instances at which the magnitude of the signal reaches a predetermined value, or the difference between instantaneous and preceding signal magnitudes exceeds predetermined value.

This known solution utilizes for sampling the principle of comparator monitoring already known and widely used in other fields of application. U.S. Pat. Nos. 3,657,646 (Zmyslowski), 3,298,014 (Stephenson), 3,903,470 (Mirabile), 4,152,642 (Dohety) and 4,210,904 (Renzel) are mentioned in this regard, by virtue of which the sampling of signals is rendered possible over a wider frequency range than is possible with conventional sampling systems.

From the patents listed above, Stephenson has devised a type of A/D converter by which signal magnitudes can be determined. A general feature of the other above references is their use in determining certain derived parameters, and not for the purpose of sampling.

For example the patent to Zmyslowski is a signal analyzer (and not a sampling device) for performing four functions on the incoming signal: determining its interference coefficient, average crest value and pulse groups, and plotting their numerical values along a graduated linear scale. From the quantities determined by the equipment—these representing average information characteristic of a given section of the train of signals—the signal itself could not be reconstructed even if the information were stored, which is not done by this equipment, being beyond the scope of the patent.

In the patent of Hinz, referred to above, this is accomplished by organizing the sampling in an adaptive way, so that with each formation of the signal value a conventional sample and hold circuit is controlled by feedback, and the instant at which an average level is reached by the signal or at which an average level is exceeded by the signal change, is monitored by means of comparators, and when either of said conditions occurs, the code of the level surpassed, together with the time that has elapsed since the preceding sampling, are recorded as a sampled value.

In spite of the advantage offered by Hinz as compared to conventional sampling methods, numerous other features inherent in Hinz represent drawbacks in its wide-range application. Specifically:

1. The equipment is nonetheless unsuitable for sampling signals of unrestricted frequency range, because although the transmitted upper frequency limit is rather high, the system is unable to transmit frequencies above this limit. The procedure used for forming sample values is complicated. The resulting complexity prolongs the transfer time of the system, determining an upper frequency fN beyond which the equipment fails to record.

2. For a sufficiently accurate sampling according to the signal value, say, at 8-bit (256-level) resolution, the number of component (e.g. of comparators, monostables, coders) that must be incorporated in the equipment becomes excessively high, rendering the setup too complex and costly.

3. With the sampling accomplished by this equipment considerable errors may arise, owing to the required feedback to the "sample and hold circuit" after each sampling. The source of these errors lies in the inherent delay causing discontinuities in the transmission. This delay is the result of the time required by the equipment to decide whether a signal received at its input has satisfied, or not, the criteria (level crossing and difference checkings). The "sample and hold" circuit will be instructed by the equipment to perform a further sampling only if this criteria has been fulfilled, yet at this instant the value of the signal will no longer be the same [value of signal at instant (t) versus value of signal at instant (t+DT)], where DT is the transmission (dead) time of the feedback of the equipment. This may cause even very large errors, if the signal happens to change during transmission time DT because the criterion is found to be fulfilled for the signal input at instant (t), whereas the equipment will use the quantity of signal value prevailing at instant (t+DT) as the basis for further sampling.

This is all the more disadvantageous, since the previous obvious error can be expected to occur with nearly all samplings, so that a given error will be carried over to all subsequent samplings.

The source of the above disadvantage lies in utilizing the "sample and hold circuit" as an essential element of the sampling equipment and in treating adaptively the amount of change taking place in the value as critical information.

4. The value of the monitored levels is rigidly fixed within a given equipment, and this can be modified only by setting up newly designed equipment, owing to dimensioning problems.

5. The time intervals between successive samplings are recorded, as the equipment is incapable of recording the instants of samplings along a so-called absolute time scale commencing at an arbitrarily chosen instant $t_o = 0$, which should be in many cases a desirable final aim when resetting is to be performed. The data sampled by means of this equipment (by which so-called relative times are recorded) thus often have to be subsequently converted into absolute times, which may further distort the results due to the errors indicated in item 2. above, and to errors arising from said conversion.

6. Besides the time data, recording of the level code is required in any case, thereby unnecessarily increasing the storage capacity required for the sampling.

7. It may occur that, at an instant of sampling, a signal is found to be greater than or equal to a predetermined level and, at the same time, differ by a determined value from the previous sampling. In this case, the first and second chains of comparators may give indications at the same instant, giving rise to priority problems requiring the use of priority coding circuits, whereby the complexity, cost and operating time is further increased.

8. Considering their function, the elements of the second chain of comparators ($\pm 0.1$ V, $\pm 0.3$ V, $\pm 1$ V) are of reduced value from the point of view of sampling, since they serve only for monitoring the deviation of the signal from its previously sampled value. This may introduce serious errors in the sampling process, since if such a comparator becomes active, this brings it, at the same time, into a condition that will prevent it from becoming active again, until the signal value changes with respect to its own comparing level.

To illustrate the above disadvantage, if the analog signal intersects, in any direction, the monitoring level defined by the comparing level of a second comparator, after which the direction of the signal changes before reaching the adjacent monitoring level, and again passes across the monitoring level defined by the second comparator, at which the previous sampling took place, no repeated sampling will occur, for the signal has not changed on the difference amplifier with respect to the previous sampling. Thus, if at the monitoring level defined by the second comparators several samplings would occur in succession, only the first of them would be retained by the Hinz method. This, however, will considerably distort the signal and falsify with respect to the original signal the frequency content of the reconstructed signal. And, what is worse, this loss of information is uncontrollable, because with the first comparators and with the second comparators following the first, the error in the value of sampling is determined by the spacing between adjacent monitoring levels, whereas with the levels that follow defined by the second comparators owing to the dynamic difference formation, the error is influenced by the double spacing between monitoring levels.

Since, in the case of an unknown signal, the above mentioned events may follow each other in undefined succession, in some sections of the signal the frequencies appearing with half amplitude will also be recorded, whereas in other sections even the frequencies appearing with the double of these amplitudes become blurred. The error in signal recording is thus accidental and unforeseeable, and the frequency range and shape of the recorded signal will also become considerably distorted. The statements described in the foregoing are illustrated in FIG. 16: FIG. 16a shows an analog signal to be recorded, and FIG. 16b shows the result of sampling performed with Hinz's A/D converter. It is apparent that, owing to dynamic difference forming and to the function of the second comparators described above, the shape and frequency content of the sampled signal has become very much distorted as compared to the original, even disregarding the effect of drawback No. 3. above (changing of the analog signal during feedback), by which the signal would suffer further distortion.

Owing to the disadvantages discussed above, the equipment proposed by Hinz is unsuited for many practical applications.

Let us, for example, consider the case of the Induced Polarization (I.P.) Geophysical method, where a geological medium or certain substances are classified according to their excitability and the technical arrangement of measurement is as follows. Turning now to FIG. 13a, a current pulse of TG duration is injected into the soil between electrodes A and B, and the variation of voltage response as a function of time is monitored between two other points (M, N) of the soil.

The variation of the excitation current pulse as a function of time is shown in FIG. 14a, while that of the voltage response measured between electrodes M, N is illustrated in FIG. 14b.

If the coupling provided by the soil were replaced by purely ohmic members, then a voltage pulse appearing between electrodes M and N would be synchronous with the injected current pulse. The medium, however, will most often not be substituted by purely ohmic members, and therefore it will be found (as shown in FIG. 14b) that the voltage between electrodes M and N gradually approaches a maximum value and, after disconnecting the excitation current, a gradually decaying transient signal will be measured.

When the phenomenon described above is found to occur across electrodes M and N, the medium is termed polarizable. In order to determine material composition and geometry of the medium, however, the transient response signal must be accurately known. A similar response signal is obtained when, in the arrangement of FIG. 13b the composition of a material sample is investigated by the IP method. The frequency range of this transient response signal, however, is very wide, and at the instant of disconnection the signal changes from a value of U(TG) to the value of $\Delta U(O)$ as shown in FIG. 14b, and this change shows just the effect of the conductive members. Thus, a component of infinitely high frequency appears, followed by the transient decay of the signal, so that the effect of higher frequencies decreases and the effect of lower frequencies gradually becomes dominating right down to DC level. This produces a wide frequency spectrum, in which—ranging from 0 Hz (DC level)—the various frequencies are gradually present up to the infinitely high-frequency (voltage jump) component.

Moreover, the value $\Delta U(O)$ recorded at the instant of disconnection would be a very important parameter with the IP-method, the value of which, however, cannot be determined by means of conventional sampling methods. Namely, if the equally spaced sampling system is adapted, it will be incapable of recording the first high-frequency section of the signal, whereas in the subsequent low-frequency sections it will supply an increasing number of unnecessary (superfluous) samplings.

Unfortunately, the conditions demanded by the IP-method cannot be solved by means of Hinz's sampling equipment either, since—as described above—due to the transmission dead time of the system, the Hinz equipment is similarly incapable of transmitting frequencies higher than a certain upper frequency, thus rendering it unsuitable for use in determination of the very important $\Delta U(O)$ parameter and that of the first high-frequency section of the curve.

Since for evaluation by means of the IP method accurate recording of the entire transient response signal is needed, the monitoring levels have to be chosen so as to be sufficiently dense in the range of values of the signal, and thus disadvantage No. 2. of the Hinz equipment appears here, where the demand in components grows excessively and renders the equipment too complicated.

Since a continuously decaying signal is produced by the transient process, it will surely be true that the signal will change after every sampling, so that disadvantage No. 3. of the Hinz equipment appears here as such a sampling error, due to the dead time of feedback, which—owing to its additive nature—causes the distortion of the entire signal, creates distortion that increases gradually with increasing frequencies within the high-frequency section of the spectrum. With IP measurements, in the various material tests and fill measurements, the amplitude of response voltage may assume widely varying values, thus rendering necessary sampling equipment in which the value of monitoring levels can flexibly be varied. Here, drawback No. 4. of the Hinz equipment manifests itself.

The essential mathematical feature in evaluating the IP-method is that the instant of disconnection the excitation current pulse is taken as initial time $t_o=0$, and at every subsequent sampling the time that has elapsed since the instant of disconnection is of interest. Here, drawback No. 5. of the Hinz equipment appears, according to which the time intervals between two samplings are recorded, which thus does not immediately provide an absolute time. As a result, the sampled values cannot be directly utilized in IP-evaluation, but instead require conversion to absolute time data, increasing the time requirement and cost of evaluation. Moreover, due to the errors resulting from the transmission dead time mentioned under disadvantage No. 2. above, this conversion becomes the source of further errors, as a consequence of the laws governing the propagation of errors.

For recording the transient response signal of the IP method by means of the Hinz method the code of the monitor level is, of course, required, meaning that, due to drawback No. 6. above, this necessitates a larger storage capacity. With recording of the response signal of the IP-transient by means of the Hinz equipment, the problem of ambiguity described above under drawback No. 7. may also arise, due to the frequency of the signal varying from instant to instant.

Some of the drawbacks outlined in the foregoing also appear in other fields of application. Generally, for a given signal shape to be analyzed, accuracy of signal recording is of basic importance, but even the recognition of a simple step function (component of infinite frequency) cannot be achieved either with conventional techniques or—as shown—with the Hinz equipment.

As the signal shape analyzers require very accurate recording of signals, so the disturbing effects of errors resulting from the transmission delay and an increase of complexity of the Hinz equipment also appears here. Another field of application of this kind is the magneto-tellurical geophysical method (magneto-tellurics), where random electromagnetic Waves of various frequencies present in the atmosphere are utilized for detecting vertical stratifications of the earth. Here random signals are to be recorded, in which the useful information is carried also by a wide frequency spectrum. Besides these, in all fields of signal recording and processing the deficiencies of methods of distributed sampling, including those of the Hinz method have to be faced, where wide-spectrum signals unknown in advance are to be safely recorded at a given accuracy while requiring minimum storage capacity.

In the following a sampling method and a sampling equipment (A/D converter) for its accomplishment will be described, by means of which the deficiencies of conventional sampling methods (gapless recording—loss of components of certain frequencies as a result of sampling, unnecessarily large storage capacity) and the drawbacks of the Hinz equipment described above can be eliminated.

SUMMARY OF THE INVENTION

The invention seeks to provide a method and apparatus for transmitting signal components exceeding the Nyquist frequency, that permits accurate signal forming with a minimum number of samplings, and is suitable for the sampling of any unknown signals of any kind associated with very steep or even vertical-front (stochastic and deterministic) signals.

The invention specifies a sampling method for recording signals according to their value, independent of their frequency range, where the range of values of the signal monitoring levels are selected in advance, and where the absolute and/or relative instants at which the value of the signal is equal to that of a monitoring level are recorded as sampling information.

In one circuit arrangement according to the present method, the outputs of the level monitoring unit suitably provided with comparators are connected to the respective inputs of the pulse transmitter and channel number adjusting unit, the output of the pulse transmitter is connected to one input of the single-channel sample value former and recorder, and the output of the channel number adjusting unit is connected to the other input of the single-channel sample value forming and recording unit. According to another circuit arrangement, each output of the level monitoring unit suitably provided with comparators is linked up through a pulse transmitter with a respective input of the multi-channel sample value forming and recording unit.

In a third circuit arrangement according to the invention, a signal to be sampled is fed to the first input of the signal value determining unit, to its second input is fed the first output of the feedback and correcting unit as well as to the first input of the signal value determining and storing unit, to the first input of the gating unit is connected the second output of the signal value determining unit, and to the sixth input of the signal value determining and storing unit is connected the first output of the gating circuit, to the fifth input of the sample value determining and storing unit is connected the third output of the signal value determining unit, the second, third, fourth and fifth output of the sample value determining and storing unit are linked up with the respectively numbered inputs of the feedback and correcting unit, and the second, third and fourth input of the feedback and correcting unit is connected with the respectively numbered inputs of the sample value forming and storing unit.

BRIEF DESCRIPTION OF THE DRAWINGS

The invention will be described in further detail with reference to the accompanying drawings, in which:

FIGS. 5a and 5b are the circuit arrangement according to a third embodiment of the invention;

FIGS. 13a and b show the field and laboratory measuring setup of the geophysical Induced Polarization Method;

DETAILED DESCRIPTION OF THE INVENTION

Let us invert the basic idea of sampling used so far by recording the instants at which preset signal levels are attained, instead of the signal values taken at preset instants of sampling. The range of the so-called "monitoring levels" covering the range of values of the signal to be recorded is to be preset and the instants are to be recorded at which the signal attains the value of each monitoring level. As many channels are required for sampling as the number of preset monitoring levels. This can be formulated mathematically in the following way:

$$t_{k,i} = t \cdot \delta(x - x_k) \qquad (1)$$

$$k = 1, 2, \ldots N$$

$$i = 1, 2, \ldots I_k$$

where
  $t_{k,i}$ is the series of sampled instances where the value of the k-th "monitoring level" is attained by the signal,
  t is the time parameter of the process,
  $\delta(x - x_k)$ is the Dirac-pulse within the range of values of the process, at the value of the k-th monitoring level,
  $x_k$ is the value of the k-th monitoring level,
  $I_k$ is the number of samplings pertaining to the k-th monitoring level,
  N is the number of monitoring levels.

In the course of performing the procedure, the number of monitoring levels provided is selected according to the task and accuracy requirements. The number of monitoring levels is variable at will, and their values may be adjusted as required.

Figure 1:
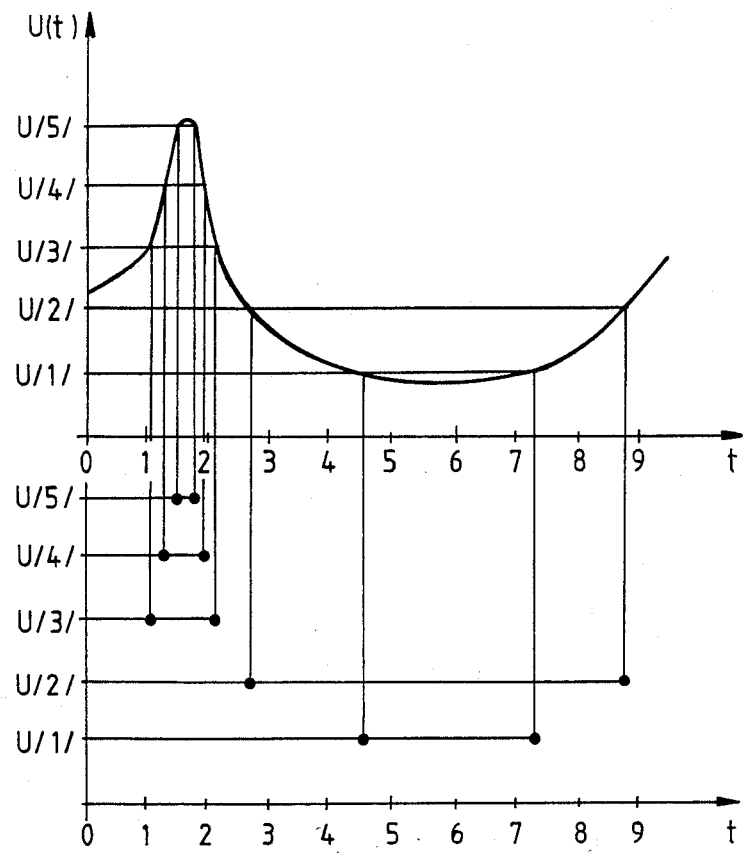
FIG. 1 shows the sampling method of the present invention, using monitoring levels applied to a given curve.

For the sake of simplicity, FIG. 1 shows a sampling according to the present invention, with five equally spaced monitoring levels. Instants pertaining to such points are recorded at which the given curve, i.e. the signal to be recorded, attains the constant values of the monitoring levels. The determination of these instants may be based on the time elapsed since the beginning of sampling, or as it results from Equation (1) (recording of absolute value) or on that taken from any preceding sampling (recording of relative value). The dynamics of signal variation is resiliently followed by this procedure well describing the signal, therefore this type of sampling may also be termed as dynamic sampling.

Instead of the equally spaced monitoring levels the series of monitoring levels may also be unequally spaced.

In principle, no frequency limit is imposed on the dynamic sampling method according to the invention, as it is capable of transmitting signal changes of whatever dynamics and shape, provided their amplitude exceeds the spacing between two adjacent monitoring levels.

Figure 2:
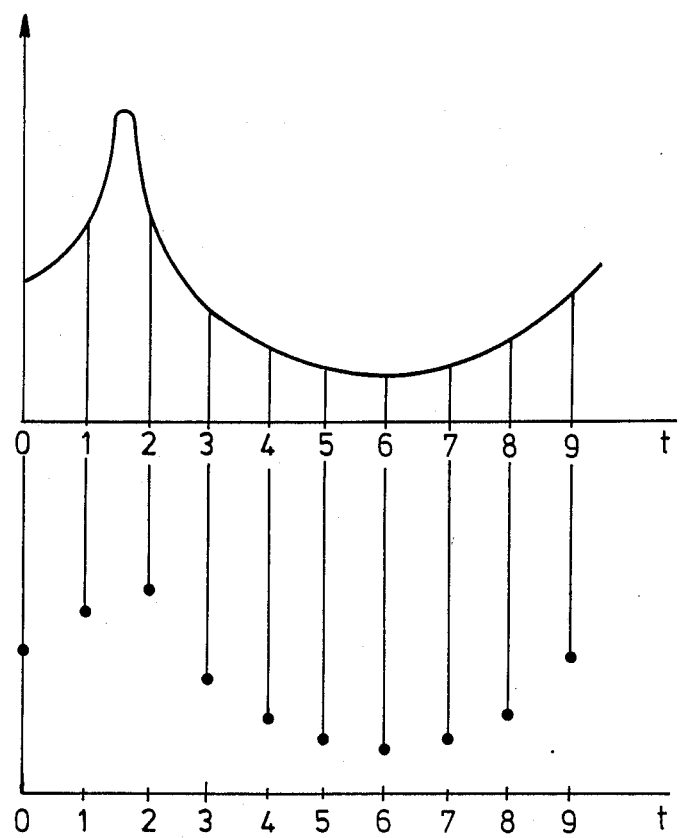
FIG. 2 shows sampling according to the prior art, made at equal intervals over a given curve.

From a comparison of FIGS. 1 and 2 it becomes clear that, given identical samples, the original signal can be reconstructed more accurately from the data sampled and recorded by means of dynamic sampling than from those obtained with equally spaced sampling.

Sampling is effectively performed when with a given error the original signal can be reconstructed from the lowest possible number of samplings.

Let us now find the number of samplings required for the reconstruction of a signal composed of several components (assuming the amplitudes of components of different frequencies are nearly equal) with a given error, with the methods of equally spaced sampling and dynamic sampling.

The required accuracy can be adjusted by the number (N) of samples taken over a cycle time. With dynamic sampling this can be achieved by taking a sufficient number of samples, whereas with equally spaced samplings the requirement is to have N samples taken within one cycle of the signal component of the maximum frequency present in the signal, by which also the interval between successive samplings is determined.

Let us now assume the maximum occurring frequency to be $f_1$, and let the monitoring levels and the sampling interval be selected so that with both dynamic and equal-interval sampling the number of samples taken from each cycle be uniformly N. This may be expressed:

$N_i = N_d = N$ where $N_i$, $N_d$ represent respectively the number of samples taken by means of equal-interval and dynamic sampling during the cycle time $T_1$ of the component of frequency $f_1$.

The number of samples taken within unit time is thus $n_i = n_d = N/T_1$. Let us now also consider a component of frequency $f_2 < f_1$, having a cycle time of $T_2$. Then, the number of samplings within a cycle time is $N_d = N$ $N_i = T_2 N/T_1$, whereas the number of samples taken per unit time is $n_d = N/T_2 = N \cdot f_2 ; n_i = N/T_1 = N \cdot f_1$.

From $T_2 > T_1$, it follows that $N_d < N_i$ and $n_d < n_i$. Let us now consider a signal of duration t, in which K number of components of different frequencies are present, and the time corresponding to each component is $\Delta t_k$. In that case, with equal-interval sampling the number of samples obtained will be $$N_i = \sum_{k=1}^{K} \Delta t_k N \cdot f_{max} = t \cdot f_{max} N \qquad (2)$$

whereas with dynamic sampling the number of samples will be $$N_d = \sum_{k=1}^{K} \Delta t_k \cdot f_k N \qquad (3)$$

Since $f_k \leq f_{max}(k=1, 2, \ldots K)$, $N_d < N_i$.

By boundary transition the above chain of thoughts may be transferred also to the case of transient signals.

By means of the present method of dynamic sampling an optimum may be attained in that just the necessary minimum number of samples will be taken to achieve a predetermined error.

It can easily be seen from equations (2) and (3) that the advantages of dynamic sampling will be most evident when the difference between the lowest and highest frequency components occurring in the sample is large, i.e. when signals of wide frequency bands are sampled.

The reduction in the number of samplings taken by means of this method will be especially evident when the process to be sampled is of a long period. The period is considered long when the process lasts much longer than the duration of the interval containing the largest changes occurring in the signal, that is, the cycle time of the highest frequency component.

The present sampling method is thus suitable for treating signals of wide frequency spectra and long duration (requiring a high number of samples to be taken when using known methods).

Furthermore, its use is also advantageous when accurate recordings are to be achieved. For sampling with a given error, a minimum number of samplings is desired. In the case, however, where signal sections of very high frequencies (e.g. a jump function) are required to appear in the record, no other method will be available to obtain the desired result.

With the present sampling method, so-called monitoring levels (u(1), u(2), u(3), u(4), u(5) in FIG. 1) are established within the range of signal values to be recorded, and the instants are recorded at which the analog signal passes across any of these monitoring levels.

It may occur that a signal exceeds the highest monitoring level u(max). In such a case, the range of monitoring levels have to be displaced upwards by adding a constant value to the value of each monitoring level. This constant is just equal to the difference between the former maximum and minimum value of monitoring levels:

u(max)−u(min).

Hence, in this case, the new value of the lowest monitoring level will be equal to the former value of the highest monitoring level.

$u(min)^{new} = u(max)^{former}$.

It may occur that the signal value to be recorded is lower than the value of the lowest monitoring level u(min). In such a case, the range of monitoring levels has to be displaced downwards. Hence, in the case, the new value of the highest monitoring level will be equal to the former value of the lowest monitoring level.

$$u(max)^{new} = u(min)^{former}.$$

With this automatic range changing it results that the range covered by the monitoring levels will always be shifted to embrace the signal, and if, as a result of sampling, those time values are stored at which the signal is equal to a monitoring level, the sampling will be controlled by the signal itself.

Figure 16:
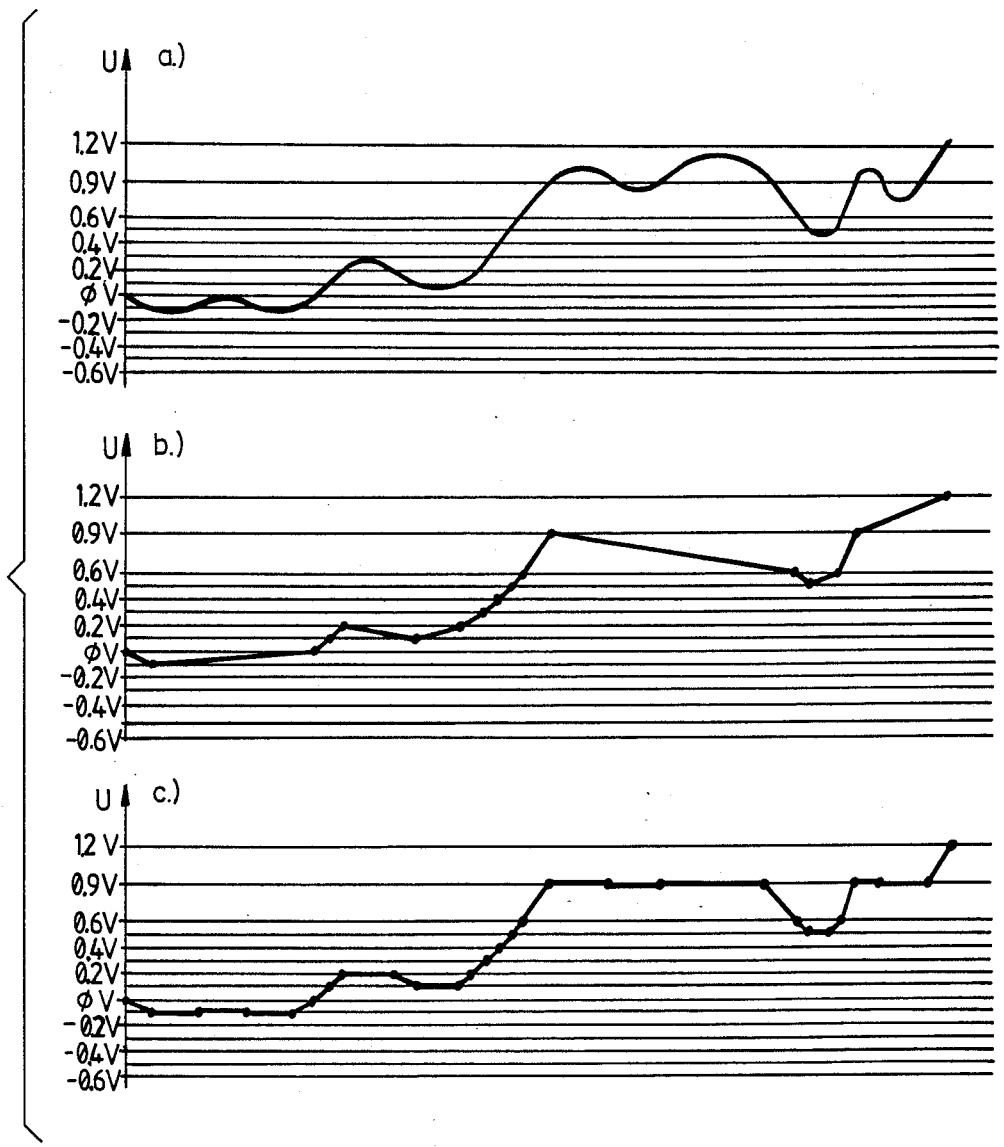
FIGS. 16a, b and c show a comparison between the Hinz method and the claimed sampling method.

The introduction of automatic range changing considerably decreases the complexity of sampling equipment and the quantity of component parts, since hardware is needed for building only a few monitoring levels. By using the present sampling method and equipment for its realization, drawback No. 2 above of the Hinz method and equipment is eliminated. Furthermore, as shown in FIG. 16a, the sampling method described in the foregoing eliminates drawback No. 8 of the Hinz sampling, resulting from the false concept of dynamic difference formation determined by the second comparators.

Let us now investigate the signal at each monitoring level, independently of the others. That is, the hardware of the monitoring levels are developed in parallel with each other, so that for each monitoring level only those time values at which the signal value equals the value of the monitoring level, are successively stored in that portion of memory pertaining to the monitoring level in question. Thus, the present method does not require recording the code of a particular monitoring level with each sample value formation, whereby drawback No. 6 above of the Hinz equipment is eliminated, resulting in a considerable reduction of required storage capacity. Besides economizing on memory capacity, a much more important consequence resides in the possibility of providing equipment falling into a qualitatively different category, since if, according to the principle mentioned before, the monitoring levels are treated separately, the sampling can be effected in a way truly independent of the frequency range, and is thus capable of transmitting any signal component ranging from a change of infinite frequency (step function) down to the level of zero frequency.

Thus, drawback No. 1 of the Hinz method is also successfully eliminated.

Figure 15:
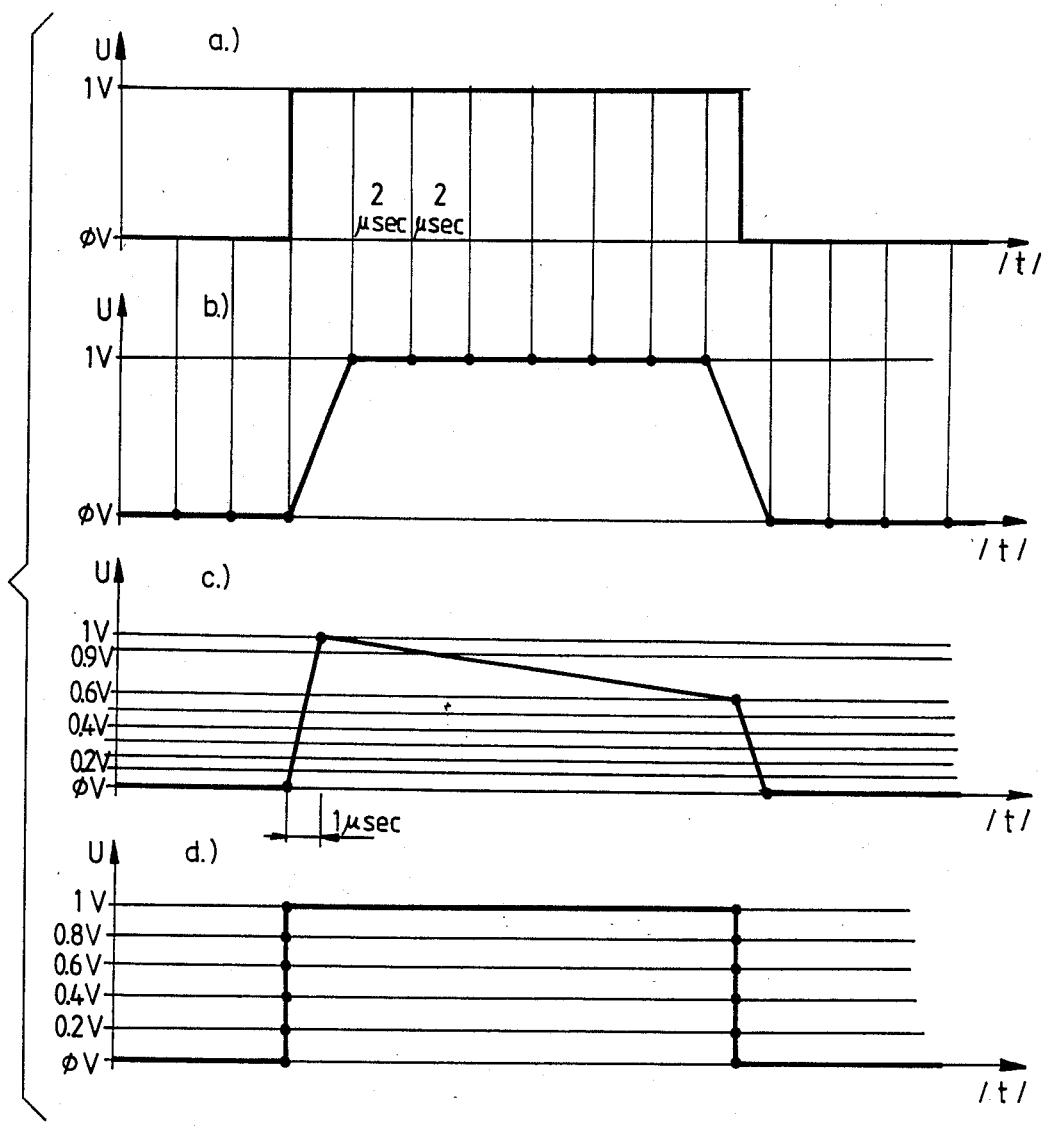
FIGS. 15a, b, c and d show a comparison of the equal-interval method, the Hinz method and the claimed method for sampling.

In FIG. 15, samples taken from a rectangular pulse are shown.

FIG. 15a shows the original rectangular pulse, FIG. 15b shows the same rectangular pulse as sampled by conventional equal-interval sampling, FIG. 15c is the rectangular pulse sampled by the Hinz method, whereas FIG. 15d shows the rectangular pulse sampled according to the present invention. It should be noted here that in FIG. 15c the error resulting from the feedback control of Hinz's equipment has not even been taken into consideration, as if the transmission (dead) time of the equipment were nonexistent, which is obviously not true; even with that idealization it can be seen that only the sampling shown in FIG. 15d has left the signal undistorted as regards its frequency content.

A disadvantage of the present sampling method is that it may shift the signal by a half cycle of the clock: this shifting, however, is of a very limited extent in the case of a suitably high clock frequency and represents for each monitoring level only a constant delay; hence it does not distort the shape and frequency content of the sampled signal. With the specified sampling no ambiguity problems arise, so that no priority coding is necessary, and drawback No. 7 above of the Hinz method does not exist.

There is no need to monitor the magnitude of signal changes in the present invention, and the conventional feedback-controlled sample and hold circuit thus becomes expendable, since, by setting the comparators to the reference values of monitoring levels, only the instants have to be recorded at which the respective comparator unit set to the level concerned has been activated.

Figure 3:
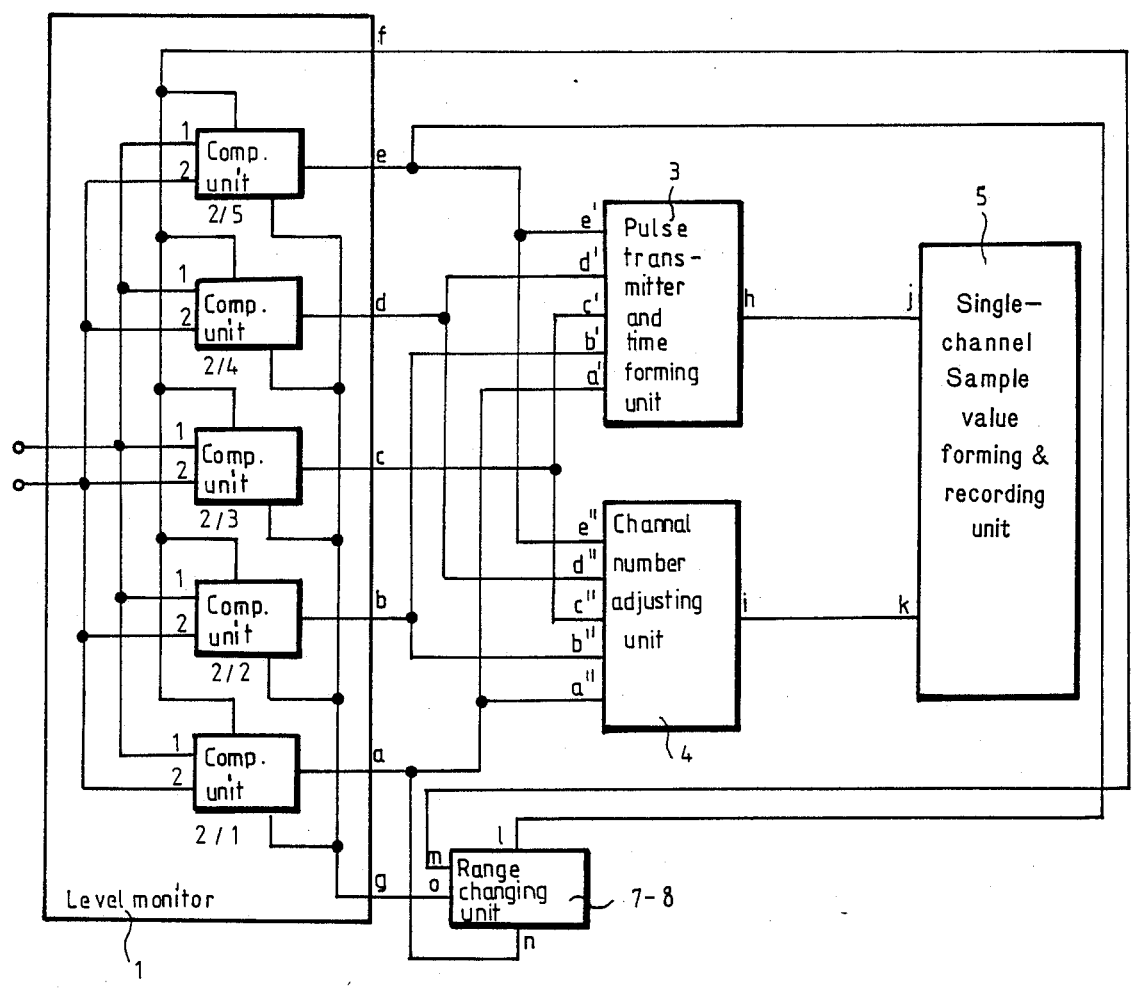
FIG. 3 is the circuit arrangement according to a first embodiment of the invention.
Figure 4:
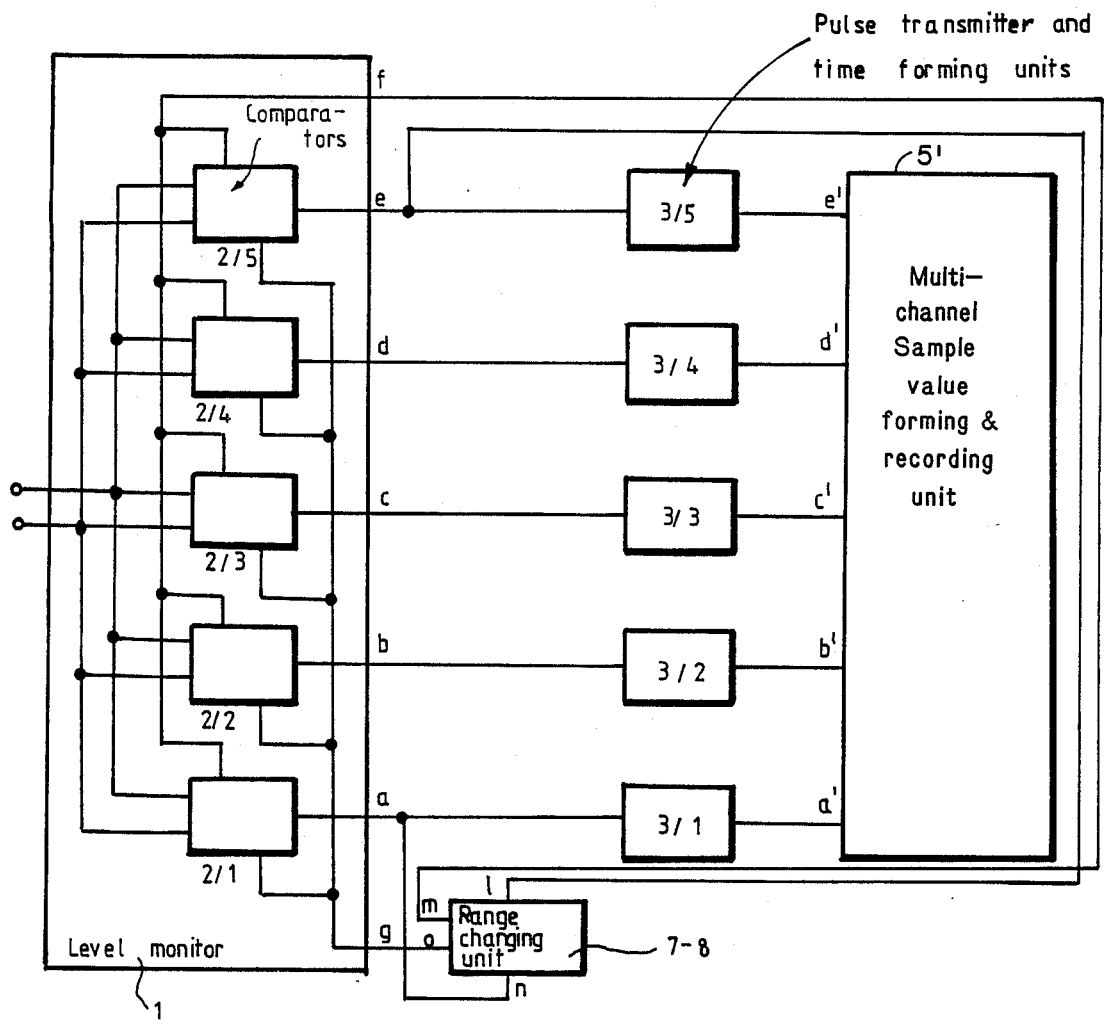
FIG. 4 is the circuit arrangement according to a second embodiment of the invention.

The connection diagrams of FIGS. 3 and 4 accordingly contain no conventional sample and hold circuits. The procedure is thus devoid of drawback No. 3 of the Hinz equipment where considerable errors arise due to the finite transmission time of the feedback branch of the feedback-controlled sampling circuit when varying signals are to be sampled.

The circuit arrangement of one basic type of equipment serving for the implementation of the method according to the invention is shown in FIG. 3.

By way of example, an analog signal is fed to a signal input of level monitor 1. This monitor comprises as many comparator units as the number of channels in the sampler. In FIG. 3 a five-channel monitor is shown. Each comparator unit 2 (2/1, 2/2, 2/3, 2/4, 2/5) is provided with an output terminal (a, b, c, d, e) connected to the respective input (a', b', c', d', e') of the pulse transmitter and time forming unit 3 and to the respective input (a'', b'', c'', d'', e'') of the channel number adjusting unit 4.

In addition to the above connections, output terminal (a) of the lowest-value comparator 2/1 is connected to input (n) of the positive-negative range changing unit 7-8, and output terminal (e) of the highest-value comparator 2/5 is connected to input terminal (l) of the same range changing unit 7-8. Range changing unit 7-8 has two output terminals marked (m) and (o). Output (m) is connected to input (f) of level monitor 1, whereas output (o) is connected to input (g) of level monitor 1. Pulse transmitter and time forming unit 3 is connected through bus h-j, and channel number adjusting unit 4 is linked up through bus i-k, with single-channel sample value forming and recording unit 5.

Figure 7:
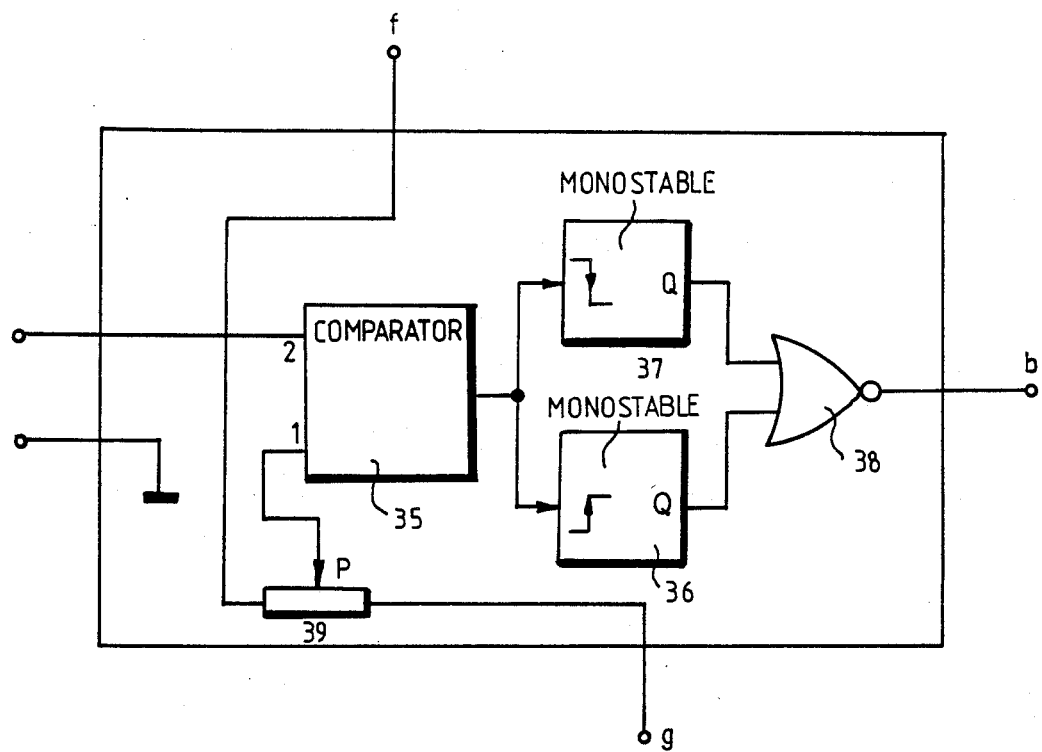
FIG. 7 is the circuit arrangement of the comparator units.

The internal structure of the comparators 2 can be seen in FIG. 7, where comparator 2/2 is illustrated, it being understood that the setup and operation of all other comparator units corresponds to that of comparator 2/2. The comparator unit consists of comparator 35 (e.g. of type LM 311), positive edge triggered monostable 36, negative edge triggered monostable 37 (e.g. of type SN 74221), NOR gate 38 (e.g. of type SN 7402) and potentiometer 39.

One pole of the analog signal is connected to the ground potential of the comparators 2, and the other to the signal input (marked 2) of comparators 35. The reference input (marked 1) of each comparator 35 is led to its corresponding potentiometer 39. Thus, the reference voltage levels of comparators 35 can be adjusted through potentiometers 39 by means of range changing unit 7-8, since the voltage supply to potentiometers 39, as seen from FIGS. 3 and 7, is taken from input terminals (g) and (f) of level monitor 1, and these inputs, as described above, are connected to outputs (o) and (m) of range changing unit 7-8.

Thus, the reference voltages of comparators 35 of comparator units 2 can be arbitrarily adjusted. By means of a given equipment the adjustment of several combinations of monitoring levels is possible, wherein only potentiometers 35 have to be set accordingly. When new values of monitoring levels are to be adjusted, there is no need to redimension the entire setup, so that drawback No. 4 of the Hinz equipment is avoided here.

As long as the value of the analog signal fed to the signal input of comparators 35 is lower than that of the reference voltage, a low signal level will be present also at the output of comparators 35. When the analog signal reaches or exceeds the value of a given reference voltage, then at the output of the corresponding comparator the low level changes to high level and remains high as long as the value of the analog signal is higher than the value of the reference voltage. When the analog signal drops jut below the reference voltage, then the signal at the output of the corresponding comparator 35 changes from high to low level. The instants at which the analog signal is just equal to the reference voltage of a comparator (i.e. to an adjusted value of the level monitor) are designated by the low-to-high and high-to-low signal level transitions at the output of that comparator 35.

The outputs of comparators 35 are connected to the input of positive edge triggered monostable 36 and to that of negative edge triggered monostable 37. At the output of positive edge triggered monostable 36 a positive pulse of suitable duration, say 40 ns, appears at the instant when a low-to-high signal transition takes place at the input of the monostable.

At the output of negative edge triggered monostable 37 the positive pulse of advantageously 40 ns duration appears when a high-to-low signal transition takes place at the input of monostable 37. To one of the two inputs of NOR gate 38 the output of positive edge triggered monostable 36 and to their other input the output of negative edge triggered monostable 37 is connected. Normally, the output of NOR gate 38 is high level, and a low level appears at its output only when a positive pulse reaches either of its inputs. Thus, NOR gates 38 change the polarity of a positive pulse received at their inputs to a negative polarity pulse appearing at their outputs.

The output of NOR gates 38 being the output of comparator units 2, a negative pulse of advantageously 40 ns duration will appear at the output of all comparator units 2 when the value of the analog signal arriving at the input of the respective comparator becomes equal to the value of the comparator reference levels, be it by an increasing or decreasing signal transition across the monitoring level.

Monitoring of the analog signal is accomplished by level monitor 1 with the help of the units of comparator 2 in the way described above. As a result of this monitoring the beginning of the negative pulse (advantageously of 40 ns duration) appearing at the outputs of comparators indicates the instants at which the value of the analog signal just equals the value of the monitoring level belonging to the comparator units. For example, if the signal is equal to the value of the monitoring level defined by the setting of the reference voltage of comparator 35 of comparator unit 2/2, the negative pulse will appear at output (b) of level monitor 1.

Thus, it can be seen, in contrast to conventional sampling units and Hinz's A/D converter, that level monitoring and then, through it, the A/D conversion of signals are accomplished without using a sample and hold circuit. Level monitoring becomes thereby dynamic and less delayed, and each sampling is not repeatedly affected by the error resulting from the substantial changes of the sampled analog signal expected to occur with high probability during the rather long transmission time of the feedback branch of the feedback-controlled sample and hold circuit.

Pulse transmitter are time forming unit 3 performs the measurement and numerical definition of instants when the value of the analog signal becomes just equal to that of a monitoring level. Channel number adjusting unit 4 generates the code of the monitoring unit to the value of which the value of the analog signal has just become equal.

It may occur that the value of the analog signal is lower than that of the lowest monitoring level or is higher than that of the highest one. In other words, the analog signal goes off the scale defined by the monitoring levels.

This occurs when the analog signal drops below the reference voltage level of lowest-value comparator unit 2/1 and the signal thus is below the range of monitoring levels, or when the signal rises above the reference voltage level of highest value comparator unit 2/5, and the signal thus is above the range of the monitoring levels.

By introducing additional monitoring levels below the reference voltage level of comparator 2/1 and above the reference voltage level of comparator 2/5, the signal can be observed again. The addition of further comparator units, however, would render the system very complex due to the increased number of components when a higher resolving capability is to be achieved, as has been listed under drawback No. 2, above of the Hinz equipment. A simple sampling and simplification of the equipment can be achieved by using an automatic range changing unit 7-8 causing a reduction of the reference voltage of the existing comparator units by a constant level whenever the value of the analog signal drops to equal the reference voltage of lowest-value comparator unit 2/1, this reduction being such as to make the new value ($u(5)^{new}$) of the highest value comparator unit equal to the former value ($u(1)^{former}$) of the reference voltage of the lowest-value comparator:

$$u(5)^{new} = u(1)^{former}$$

If the value of the analog signal becomes equal to the reference voltage value of the highest-value comparator unit, then by increasing the reference voltages of the comparator units, the range of monitoring levels is displaced upwards so that the new value ($u(1)^{new}$) of the reference voltage of the lowest-value comparator unit will be equal to the former value ($u(5)^{former}$) of the reference voltage of the highest-value comparator unit:

$$u(1)^{new} = u(5)^{former}$$

Applying this range changing continuously, a monitoring level resolution of virtually any desired degree can be achieved by providing hardware channels for a few additional monitoring levels.

Making use of this principle, signal coverage becomes safe, as the range of monitoring levels is always shifted so as to include any newly occurring level while preserving the simplicity of the circuitry, thus avoiding drawback No. 2 above, of Hinz's equipment.

Figure 8:
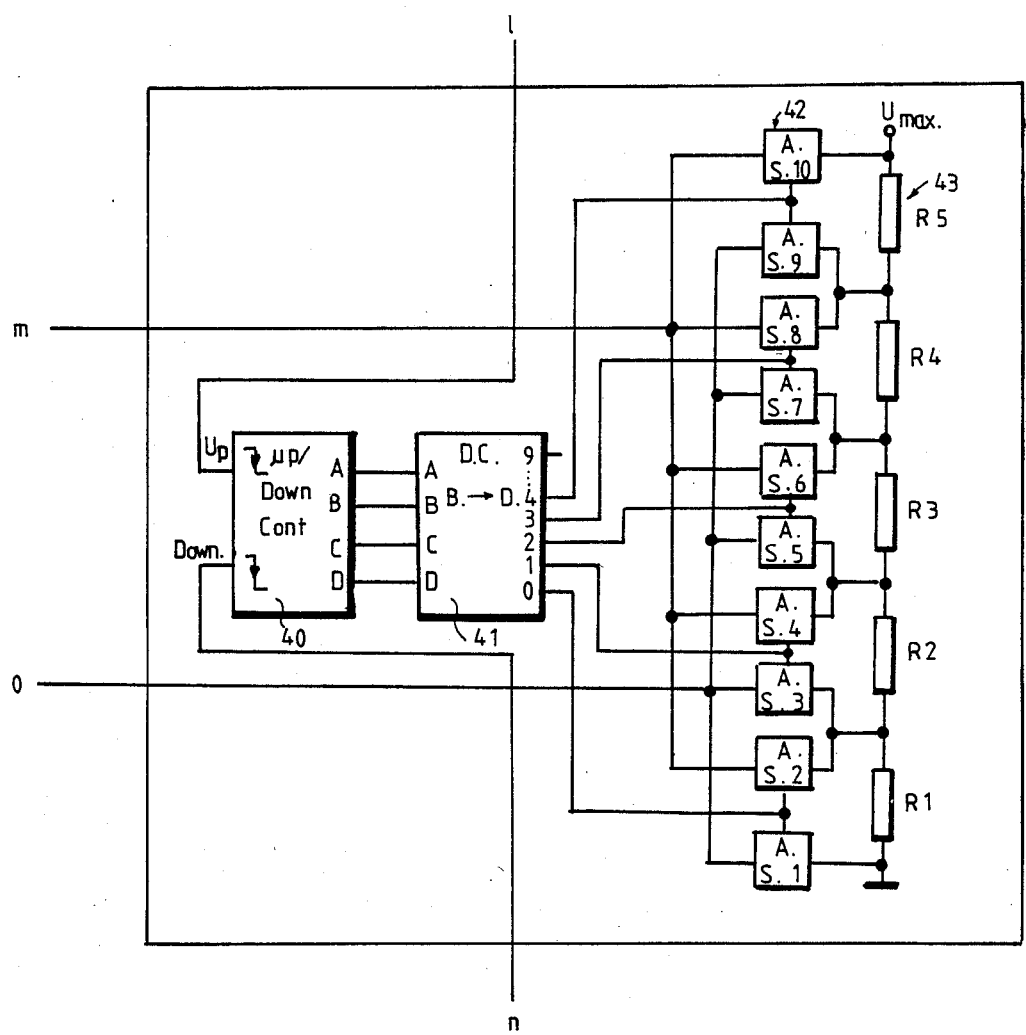
FIG. 8 is the circuit arrangement of the range changing units.

Automatic range changing is accomplished by positive/negative range clanging unit 7-8, the circuit arrangement of which is illustrated in FIG. 8.

Range changing unit 7-8 comprises up/down counter 40 (possible type: SN 74 192), decoder 41 (that can be built up of SN 74 154 or a diode matrix), analog switches 42 (A-S1, A-S2, A-S3, A-S4, A-S5, A-S6, A-S7, A-S8, A-S9, A-S10) and chain of resistors 43 (R1, R2, R3, R4, R5). Range changing unit 7-8 shown in FIG. 8 permits five positive and five negative range changes, but of course this may easily be modified, if required.

The analog switches may be of type CD 4066 or CD 4016, whereas the magnitude of shifted ranges may be influenced by the values of resistors 43 in the chain. The widths of shifted ranges will be equal when selecting equal value resistors for the chain:

$$R1=R2=R3=R4=R5$$

The "up" input of up/down counter 40 corresponds to input (1) of range changing unit 7-8, connected (as seen earlier) to output (e) of comparator unit 2/5 (i.e. the one having the highest value). The "down" input of up/down counter 40 corresponds to input (n) of range changing unit 7-8, and is connected to output (a) of lowest-value comparator unit 2/1. Both inputs of up/down counter 40 count on the negative edge, so that when a negative pulse appears at the output of highest-value comparator unit 2/5 the content of up/down counter 40 is increased by 1 at its binary outputs A, B, C, D, whereas when a negative pulse appears at the output of lowest-value comparator unit 2/1, the binary output of the counter is decreased by 1.

Binary outputs A, B, C, D of up/down counter 40 are linked up with the respective inputs of binary/decimal decoder 41. At the decimal outputs of decoder 41 corresponding to its binary input a positive ON level appears, while there will be a negative OFF level at all other outputs. For example, if binary combination 0011 is present at the input of decoder 41, then output (3) will be at positive ON level. To each output (1, 2, ... 9) of counter 41, two analog switches are connected. Thus, output (3) can operate analog switches AS7 and AS8. The odd-index analog switches connected the lower-potential terminal of the corresponding resistor (R1, R2, R3, R4, R5) of resistance chain 43 to output terminal (o) of range changing unit 7-8, whereas the even-index analog switches connect the higher-potential terminals of the resistors of resistance chain 43 with output (m) of range changing unit 7-8. Since the voltage appearing between outputs (o) and (m) is applied to inputs (g) and (f) of level monitor 1, the width of the range of monitoring levels imposed on comparator units 2 will be determined by potential difference between outputs (o) and (m) of range changing unit 7-8. Hence, if for example the positive ON level is present at output 3 of decoder 41, then switches AS7 and AS8 are on, and since all other analog switches are off, the voltage appearing between outputs (o) and (m) will be that appearing across resistor R4.

When the reference level of the lowest value comparator is intersected by the signal, then a negative sense range changing will take place so that the negative pulse will be fed to the "down" input of up/down counter 40, under the effect of which the content of the counter will decrease by 1, and the binary combination 0010 present at its output is transferred to output 2 of decoder 41, so that analog switches AS5 and AS6 connected to this output terminal will open and the voltage present across resistor R3 will be applied across outputs (o) and (m) of range changing unit 7-8.

As the highest-potential terminal of resistor R3 and the lower-potential terminal of resistor R4 are now connected to each other, the negative-sense range changing described earlier is realized. The positive-sense range changing takes place in a similar way, only the negative pulse appearing at output (e) of the highest-value comparator unit 2/5 will now be applied to an output terminal of up/down counter 40, increasing its content by 1. The opening positive level is fed again to output (3) of decoder 41, so that by opening analog switches AS7 and AS8 the range of reference voltages will gain be that present across resistor R4.

As an extra benefit, there is no need to store the times of range changes separately for unambiguous resetting, since the instants of intersections of monitoring levels defined by the reference values of highest-value comparator unit 2/5 and lowest-value comparator unit 2/1 indicate at the same time also the positive-sense range changes and negative-sense range changes, respectively.

Numerical evaluation of instants when an analog signal is equal to the value of a monitoring unit is performed by pulse transmitter and time forming unit 3, and the code of the level at which this equality has occurred is determined by channel number adjusting unit 4.

For storing the data the following possible coding system can be adopted.

The length of a data word may be 1 byte or 3 bytes.

Whether the data word is of 1-byte or 3-byte length, is indicated by the state of the first bit of the data word. Thus, the first bit of the data word is used as a control bit.

If the value of the first bit is "1", then the length of the data word is 1 byte (8 bits), if it is "0", then its length is 3 bytes (24 bits).

The time base for time measurement is provided by a clock. Let the clock frequency be designated $f_o$, determining the lowest time unit $t_o=1/f_o$. Timing is achieved by a 16-bit pulse counter 55 controlled by the clock signal, capable of measuring a maximum period of time of $2^{16} \cdot t_o$ duration. If there is no sampling during this time, the counter resets to zero. Every overflow (reset condition) is transmitted to an 8-bit counter recording the number of overflows of the 16-bit counter. Let the maximum time that the 16-bit counter is capable of measuring be denoted $\Delta T=2^{16} \cdot t_o$. Regarding now $\Delta T$ as a rough time unit, the content of the 8-bit counter corresponds to a period expressed in such units. For counting, however, only seven bits of the 8-bit counter are utilized, and the most significant 7th bit is used as control bit. Should an overflow of the 16-bit counter occur at least once, then this bit is set to "1", whereas with no overflow having occurred, the value of the bit remains "0". Correlating this control bit with the control bit mentioned in conjunction with the data word, the same can be formulated so that if the first bit of the data word is "1", then the length of the data word is 1 byte and at least one overflow has already occurred at the 16-bit counter.

If the further seven bits of the data word are made to correspond to the 7 bits of the 8-bit pulse counter utilized in counting, then the content of the last 7 bits of the 1-byte data word represents just how many times an overflow of the 16-bit counter has occurred. Should the 16-bit pulse counter have overflown three times, then the 1-byte data word indicating the overflows will assume the following form:

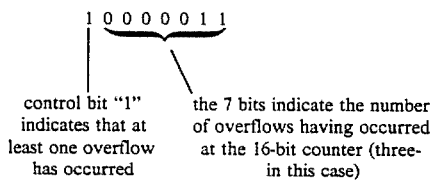

control bit "1" indicates that at least one overflow has occurred the 7 bits indicate the number of overflows having occurred at the 16-bit counter (three- in this case)

When the number of overflows in the 16-bit counter has reached $2^7$, then the last 7 bits of the 8-bit pulse counter also reset to zero, and this will occur within a time of $T=2^7 \cdot 2^{16} \cdot t_o$.

Thus, $T-t_o$ is the longest period over which the 16-bit and 8-bit counters are capable of digitizing. Consequently, after every period T, a so-called rough time raster signal has to be introduced by a 1-byte data word of the following form:

10000000.

This means that the 16-bit pulse counter has overflowed $2^7$ times, corresponding to a time period of $T=2^{23} \cdot t_o$.

When the value of the first bit of the data word is "0", then as already stated, the length of the data word will be 3 bytes and will be of the following structure:

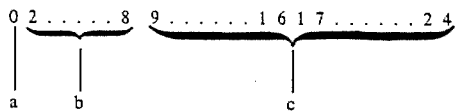

wherein
(a) Value of the control bit is "0" indicating the data word is 3 byte long.
(b) Code of that monitoring level to the value of which the value of the analog signal is equal.
(c) Content of the 16-bit pulse counter, the numerical value of the time being expressed in $t_o$ units.

For example, when the sample value forming takes place at monitoring level 3 at instant $6 \cdot t_o$, then the content of the 3-byte data word will be

000000110000000000000110

The first bit of the 3-byte data words is a control bit, the value of which is always 0, whereas in bits 2 to 8 the level codes, and in bits 9 to 24 the digitalized time data are recorded.

The coding of the structure and content of the 1-byte and 3-byte data words may be summarized as follows:

1-byte data word:

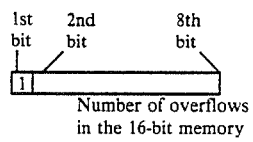

Number of overflows in the 16-bit memory 3-byte data word:

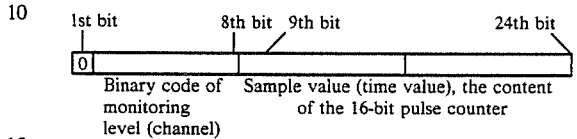

Binary code of monitoring level (channel)

Sample value (time value), the content of the 16-bit pulse counter

Let us see now how an intersection with a monitoring level may take place in the 16-bit and 8-bit counters. There may be three different cases:
(1) No overflow has occurred in the 16-bit counter: a single 3-byte data word is formed. For example, when sampling has taken place at the 4th monitoring level in the 39-th $t_o$ period of time, then the 3-byte data word will be of the following form:

000001000000000000100111

(2) At least one overflow has already occurred on the 16-bit counter, but the number of overflows has not reached $2^7$: In that case one 1-byte data word + one 3-byte data words are generated, such that the 1-byte word precedes the 3-byte word. The 1-byte data word indicates the number of overflows having occurred at the 16-bit counter, whereas the 3-byte data word contains the code of the monitoring level intersected by the analog signal and the numerical value (indicated by the actual contents of the 16-bit counter). For example, when up to the sampling taken at monitoring level 3 the 16-bit pulse counter has overflown already twice, and since the instant of the last overflow an additional time of $11 \cdot t_o$ has elapsed, then the 1-byte and 3-byte data words will be as follows:

10000010

000000110000000000001011

(3) The 16-bit counter has overflown just $2^7$-times, and still no intersection of a monitoring level (sampling) has occurred.
At this instant a single 1-byte data word is generated in the following form, representing the time unit $T=2^{23} \cdot t_o$ of the course time raster:

10000000

To demonstrate the unambiguity of coding, reference may be had to the following table, where—in the case of absolute-time recording—information sampled from the indicated monitoring range is recorded at the time given.

| Serial no. of monitoring level | Instant of sampling after starting expressed in units $t_0$ | Sampling information in binary code |
|---|---|---|
| 4 | $58 t_0$ | 000001000000000000111010 |
| 3 | $65534 t_0$ | 000000111111111111111110 |
| 2 | $6 \cdot 2^{16} t_0 + 15 t_0$ | 10000110 |

-continued

| Serial no. of monitoring level | Instant of sampling after starting expressed in units $t_0$ | Sampling information in binary code |
| --- | --- | --- |
| 2 | $2^7 \cdot 2^{16} t_0 + 256 t_0$ | 000000010000000000001111<br>10000000 |
| 3 | $2 \cdot 2^7 \cdot 2^{16} t_0 + 12 \cdot 2^{16} t_0 + 1 t_0$ | 000000100000000100000000<br>10000000<br>10001100<br>000000110000000000000001 |

The time measurement and digitalization is performed by pulse transmitter and time forming unit 3 of the equipment, whereas the coding of monitoring levels is accomplished by channel number adjusting unit 4.

Figure 9:
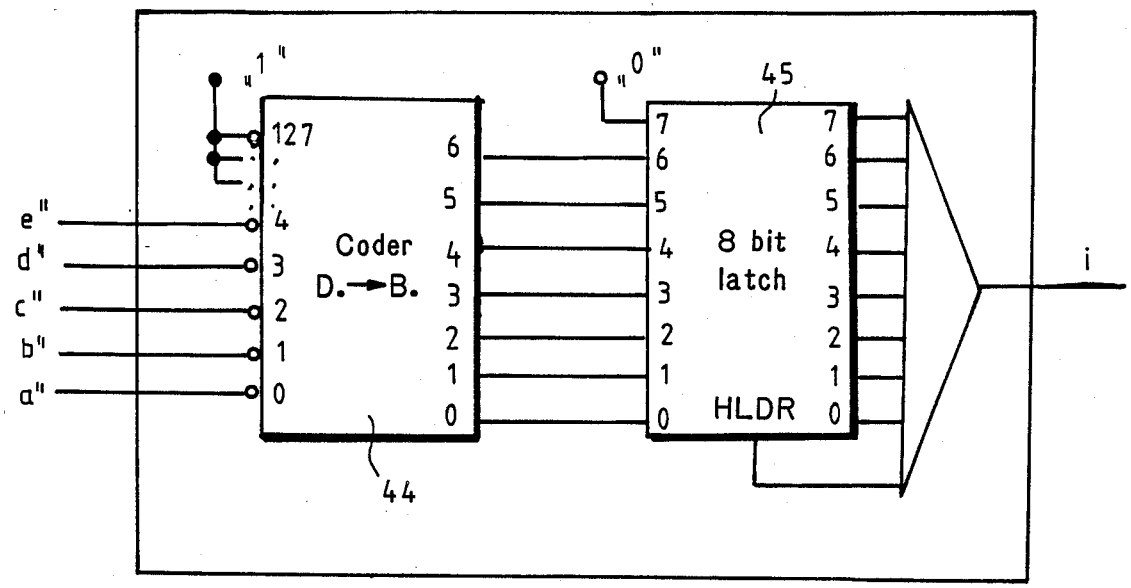
FIG. 9 shows the circuitry of the channel number adjusting unit.
Figure 10:
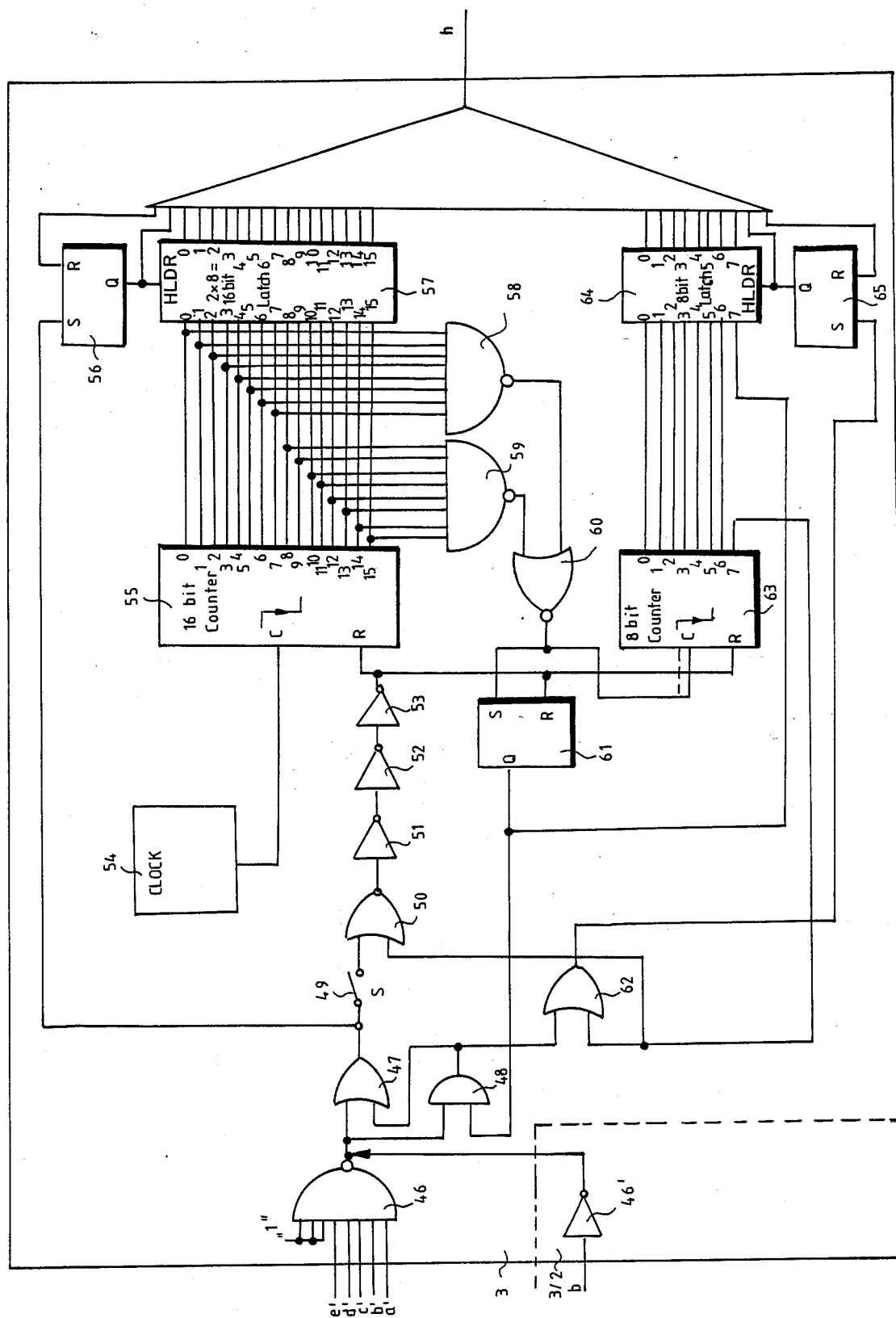
FIG. 10 shows the circuitry of the pulse transmitter and time forming unit.

The structure of channel number adjusting unit 4 is shown in FIG. 9, whereas that of pulse transmitter and time forming unit 3 is illustrated in FIG. 10. Channel number adjusting unit 4 comprises decimal-binary coder 44 (that may be based on an SN 74154 or a diode matrix) and 8-bit latch 45 (applicable type SN 74LS273).

Coder 44 may advantageously be a 7-bit unit with 128 inputs (0, 1, ... 127), capable of handling a maximum number of 128 monitoring levels within the range of monitoring levels.

The equipment shown in FIG. 3 comprises 5 monitoring levels, therefore outputs (a), (b), (c), (d) and (e) of the comparator units of the respective monitoring levels are connected to inputs (a''), (b''), (c''), (d''), (e'') of channel number adjusting unit 4, and these inputs correspond to inverting inputs 0, 1, 2, 3 and 4 of coder 44. Since the other inverting inputs (5, ..., 127) are not used in this case, they are connected to the fixed high "1" level. When one of the monitoring levels is intersected by the value of the analog signal, the negative pulse appearing on the output of the comparator unit pertaining to the monitoring level in question is fed to the corresponding inverting input of coder 44 where it is changed to a positive pulse. The decimal serial number of that input terminal of coder 44 where the positive pulse has been formed, is transformed at its output into a 7-bit binary code combination, so that the unambiguous binary bode of that monitoring level is produced where the level intersection (sampling) has taken place. Binary outputs 1, 2, ... 6 of coder 44 are connected to the lowest seven inputs 0, 1, ... 6 to 8-bit latch 45, whereas a fixed low "0" level appearing at input 7 of latch 45 adjusts the value of the first control bit mentioned earlier in conjunction with coding, since—if coding takes place—this is invariably associated with the formation and storing of a 3-byte data word; in the case of a 3-byte data word, however, the value of the first bit (control bit) is 0.

Outputs 0, 1, 2, 3, 4, 5, 6, 7 of latch 45 branched in parallel on a BUS are led to output (i) of channel number adjusting unit 4. At the output of latch 45, proceeding from its output terminal (7) towards output (0), the first byte of the 3-byte data word appears As seen in FIG. 10, pulse transmitter and time forming unit 3 comprises an R-S flip-flop 56. The "Q" input of flip-flop 56 is connected to input HLDR of latch 45, via BUS h-j arranged between pulse transmitter and time forming unit 3 and single-channel sample value forming and storing unit 5, through the own BUS (see FIG. 11) of said single-channel sample value forming and storing unit 5, and through BUS i-k arranged between channel number adjusting unit 4 and single-channel sample value forming and storing unit 5. Since high "1" level signal appears at output "Q" of R-S flip-flop 56 when intersection of a monitoring level occurs, therefore the information contained in the code of the monitoring level is retained at its outputs as long as the input of HLDR is at high "1" level. When a low "0" level appears at the output of HLDR, the latch "rewakens" and from that instant the code information is kept running until a high "1" level is sent to the HLDR input by R-S flip-flop 56.

Thus, latch unit 45 is controlled by R-S flip-flop 56, at the output of which the signal resets to low "0" level when an acknowledging high "1" level appears at its input R. This occurs when single-channel sample value forming and storing unit 5 has completed storing, editing and recording the 3-byte data word.

Figure 11:
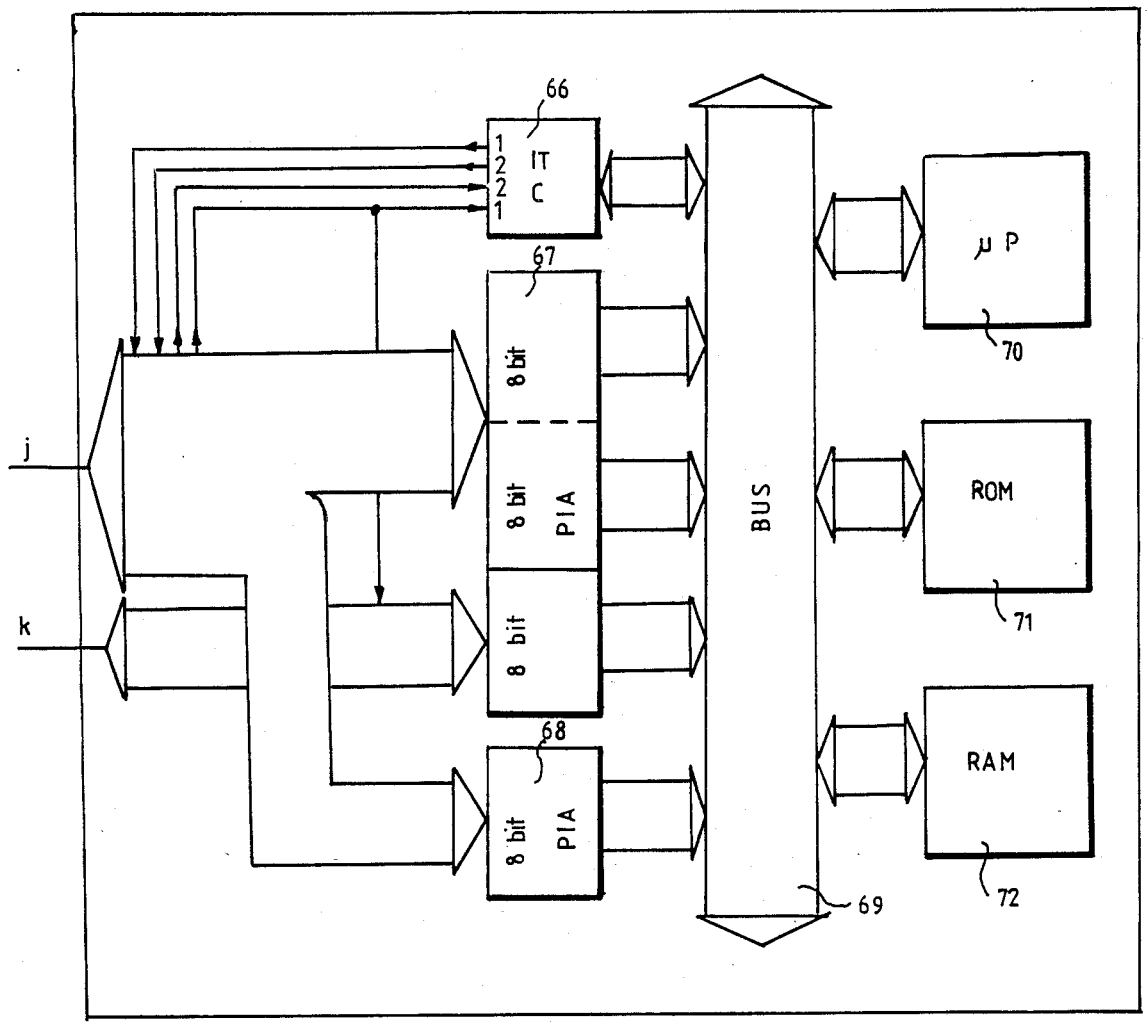
FIG. 11 is the circuit arrangement of the single-channel sample value forming and recording unit.

The structure of single-channel sample value forming and storing unit 5 is shown in FIG. 11. From FIGS. 10 and 11 it can be seen that single-channel sample value forming and storing unit 5, after formation and recording of the data word with the help of microprocessor 70 and interrupt controller unit 66, sends a data acknowledging positive "1" pulse through bus h-j to input R of R-S flip-flop 56.

From FIGS. 3, 9, 10 and 11, it will become apparent that between channel number adjusting unit 4 and single-channel sample value forming and storing unit 5 a parallel 9-line data transmission bus i-k is present, and between pulse transmitter and time forming unit 3 and single-channel sample value forming and storing unit 5 a parallel 28-line data transmission bus h-j is present.

Obviously, either or both of the two buses may be replaced by a single line, and, instead of parallel data transmission, series transmission could be adopted. This would, however, bring about a considerable increase of the time of data transmission, therefore the parallel method described here is more favorable.

The operation of pulse transmitter and time forming unit 3 will be described in detail with reference to FIG. 10.

Pulse transmitter and time forming unit 3 contains eight-input NAND gate 46, two-input OR gate 47, two-input AND gate 48, switch 49, two-input NOR gate 50, delay inverters 51–53, clock oscillator 54, 16-bit counter 55, R-S flip-flop 56, 16-bit latch unit 57, eight-input NAND gates 58, 59, two-input NOR gate 60, R-S flip-flops 61, 65, two-input OR gate 62, 8-bit counter 63 and 8-bit latch unit 64. Inputs a', b', c', d' and e' are connected in succession to the first five inputs of the eight-input NAND gate 46, whereas to the remaining three inputs of NAND gate 46 a fixed high "1" level is applied.

Since outputs a, b, c, d, e of comparator units 2, connected to the first five inputs of NAND gate 46, are normally at high "1" level, therefore on the output of NAND gate 46 connected, on the one hand, to one input of OR gate 47 and, on the other hand, to one input of AND gate 48, normally a low "0" level appears. To the other input of OR gate 47 the output of AND gate 48 is connected, the other input of AND gate 48 being connected to output Q of R-S flip-flop 61. The output of OR gate 47 is connected, on the one hand, to input S of R-S flip-flop 56 and, on the other hand, through switch 49 to one input of NOR gate 50. The output of AND gate 48 is also connected to one of the inputs of OR gate 62. To the other input of OR gate 62 the output of the longest (7th) bit of 8-bit counter 63 is attached. This output 7 is also connected to the other input of NOR gate 50. The output of NOR gate 50 is joined through inverters 51, 52 and 53 to, on the one hand, input R (reset) of 16-bit counter 55, on the other hand, input R of R-S flip-flop 61, and finally, input R of 8-bit counter 63. The output of clock 54 is connected to the input of negative edge triggered counter C of 16-bit counter 55. The bit outputs (0, 1, ... 15) of 16-bit counter are connected in turn with the identically marked inputs (0, 1, ... 15) of the 16-bit latch 57. On the other hand, the first eight bit outputs (marked 0, 1, 2, ... 7) of counter 55 are led to the corresponding inputs of NAND gate 58, the second eight bit outputs of counter 55 (8, 9, ... 15) being connected to the corresponding inputs of NAND gate 59. The outputs of eight-input NAND gates 58 and 59 are connected to one and to the other input, respectively, of two-input NOR gate 60. The output of NOR gate 60 is led, on the one hand, to the negative edge triggered counting input C of 8-bit counter 63, while, on the other hand, it is connected with input S of R-S flip-flop 61. To input R of R-S flip-flop 56, through bus h-j, data acknowledgment output 1 of interrupt controller 66 of single-channel sample value forming and recording unit 5 is connected. Output Q of R-S flip-flop 56 is connected, on the one hand, to input HLDR of 16-bit latch unit 57, on the other hand, through bus h-j to input 1 of interrupt controller unit 66, and is further connected to input HLDR of 8-bit latch unit 45 of channel number adjusting unit 4, through buses h-j and i-k. The sixteen bit outputs (0, 1, ... 15) of 16-bit latch unit 57 are connected in parallel to bus h-j.

Outputs 0, 1, 2, 3, 4, 5, 6 of the first seven bits of 8-bit counter 63 are linked up with the correspondingly numbered (0, 1, ... 6) inputs of 8-bit latch unit 64. The output of bit (7) of 8-bit counter 63—as mentioned earlier—is attached, on the one hand, to one of the inputs of NOR gate 50 and, on the other hand, to one of the inputs of OR gate 62.

To the highest-exponent bit input 7 of 8-bit latch unit 64 output Q of R-S flip-flop 61 is connected.

To input HLDR of 8-bit latch unit 64 output Q of R-S flip-flop 65 is attached. The eight bit outputs (0, 1, 2, 3, 4, 5, 6, 7) of 8-bit latch 64 are connected in parallel to bus h-j.

To input S of R-S flip-flop 65 the output of OR gate 62 is connected, whereas its input (R) is linked up through bus h-j to data acknowledgment output (2) of interrupt controller unit 66. Output (Q) of R-S flip-flop 65 is attached, beside input (HLDR) of 8-bit latch 64, also to "data is arriving" input (2) of interrupt controller unit 66.

In pulse transmitter and time forming unit 3, time reasurement is performed by counting the pulses of clock 54, whereas the occurrence of overflows of 16-bit counter 55 and the number of overflows are recorded by 8-bit counter 63. Gating of the contents of 16-bit counter 55 to bus h-j is performed by 16-bit latch unit 57 under the effect of the control pulses of R-S flip-flop 56.

Gating of the contents of 8-bit counter 63 to bus h-j is done by 8-bit latch unit 64, under the effect of the control signals of R-S flip-flop 65.

Eight-input NAND gates 58, 59 and two-input NOR gate 60 provide for transmission toward 8-bit counter 63 when overflows of 16-bit counter 55 occur. The condition when overflow of 16-bit counter 55 has occurred at least once is recorded by R-S flip-flop 61, setting the value of the control bit to "L" or "H" (correspondingly by issuing a low or high level signal to input 7 of 8-bit latch unit 64.

A chain consisting of switch 49, two-input NOR gate 50, and inverters 51, 52, 53 performs the task of resetting 16-bit counter 55, R-S flip-flop 61 and 8-bit counter 63 to their basic position by issuing a positive triggered signal to reset their respective R inputs. Positive triggering of the Q outputs of R-S flip-flops 56 and 65 controlling the gating is performed by a logic chain consisting of two-input OR gate 47, two-input AND gate 48 and two-input OR gate 62, thereby generating the gating command.

The operation of the pulse transmitter and time forming unit 3 in connection with the three possible cases outlined above is as follows:

(1) No overflow of the 16-bit counter 55 has yet occurred, and a monitoring level is intersected by the signal. Under the effect of this intersection and, in consequence of this negative pulse, a positive "1" level appears at the output of the eight-input NAND gate 46 as long as the negative "0" pulse is present. OR gate 47 transfers this high "1" level appearing at one of its inputs to its output independently of the level present at its other input. This high "1" level, passing from the output of OR gate 47 to input S of R-S flip-flop 56, triggers output Q of the latter to level "1". The "1" high level appearing at output Q of R-S flip-flop 56 passes to input HLDR of 16-bit latch 57, and under the effect of this level, the momentary contents of 16-bit counter 55 passing to the input of 16-bit latch 57 are retained at its output. Since the momentary contents of 16-bit counter 55, expressed in units $t_o$, represents exactly that digitalized time that has elapsed up to the instant of intersection of the analog signal with the given monitoring level, the time forming the sample value is obtained in binary coded form at the sixteen bit-outputs (0, 1, ... 15) of 16-bit latch 57. The last two bytes of the 3-byte data word have thus been formed, indicating the time value. At the same time, the first byte of the 3-byte data word can be read from the eight bit-outputs of 8-bit latch unit 45 since the 16-bit latch unit 57 and 8-bit latch unit 45 are simultaneously controlled to perform gating by the positive level appearing at the Q output of R-S flip-flop 56. Since output Q of R-S flip-flop 56 is connected through buses h-j and i-k to the control input HLDR of 8-bit latch unit 45, the 16-bit latch unit 57 and the 8-bit latch unit 45 are simultaneously controlled by R-S flip flop 56.

At the highest-value output 7 of 8-bit latch 45 a fixed low "0" level is present, so this output sets the first bit, called the control bit, to "0", indicating that a 3-byte data word will follow and no overflow has yet occurred in the 16-bit counter 55. At the same time, under the effect of the control signal arriving at its output HLDR, the first seven bit-outputs (0, 1, ... 6) of 8-bit latch 45 will have maintained thereon the momentary contents of the 7-bit coder 44. These contents, however, as demonstrated earlier, are equal to the binary code of that monitoring level where a level intersection (sampling)

has just taken place. The first byte of the 3-byte data word can thus be read from the output of the 8-bit latch 45, and its second and third bytes from the output of the 16-bit latch 57.

The reading and final composition of the 3-byte data word is done by the sample value forming and storing unit 5 under the effect of the positive "1" gating control signal that appears at the Q output of R-S flip-flop 56 and is fed through BUS h-j to input 1 ("data arriving") of interrupt controller unit 66, indicating that data can be transmitted from the outputs of latch units 45 and 57 toward single-channel sample value forming and storing unit 5. After data transmission has been completed a "data acknowledgment" signal is sent through output 1 of interrupt controller unit 66 by microprocessor 70 in the form of a positive "1" pulse. This positive "1" pulse passes through bus h-j to the R output of R-S flip-flop 56 and changes to Q output of this latter to level "0", by which latch units 57 and 45 are reactivated, and the original state is restored. Here, however, it should be remembered that during the entire process a low "0" level has been present at the input HLDR of 8-bit latch 64, and the contents of 8-bit counter 63 have thus not been maintained at the 8-bit latch 64, as no overflow has yet occurred on 16-bit counter 55. Thus, it is not necessary to record the 1-byte data word indicating overflows and the number of their occurrence. Since input HLDR of 8-bit latch 64 obtained the signal from the Q output of R-S flip-flop 65, it is thus necessary to recognize that at the Q output of R-S flip-flop 65 a stable low "0" will have been present during the process. This is easily understood, since at the output of bit marked 7 of 8-bit counter 64 the level will surely be "0", no signal indicating the overflow of 16-bit counter 55 having yet arrived at the input of the 8-bit counter 64, and no overflow having taken place yet at the 16-bit counter 55. That is, the transmissions occurring upon overflow of 16-bit counter 55 are accomplished by the logic chain built up of the eight-input NAND gates 58, 59 and two-input NOR gate 60. This chain will behave as a sixteen-input AND gate, so that at the output of NOR gate 60 a high "1" level will appear only if there are high "1" levels present at all outputs of 16-bit counter 55. With the next clock pulse the overflow of 16-bit counter will set in, at all of its outputs the signal levels will thus be low "0", the output of NOR gate 60 will thus change from high "1" level to low "0", and this negative triggered signal arriving at the negative edge triggered counting input of 8-bit counter 63 will indicate the overflow of 16-bit counter 55. The positive "1" level duration of a single clock pulse preceding the first overflow passes from the output of NOR gate 60 to input S of R-S flip-flop 61, so that a high "1" level will appear at output Q of R-S flip-flop 61. Correspondingly, the signal present at output Q of R-S flip-flop 61 is an indication of whether 16-bit counter 55 has already overflown at least once, because if it has, then at output Q of R-S flip-flop 61 a high "1" level will be present; if, however, no overflow has yet occurred, then the output Q of R-S flip-flop will be at low "0" level.

Returning now to the condition when no overflow of 16-bit counter 55 has yet taken place, it may be stated on the basis of that explained above that at all eight bit outputs of the 8-bit counter 63, and hence also at its output marked 7, there will be a low "0" level signal. Output 7 of 8-bit counter 63 being connected to one of the inputs of OR gate 62, at the output of OR gate 62 a low "0" level will appear independently of the signal level present on its other input. Said low "0" level appears at input S of R-S flip-flop 63, resulting in a low "0" level being present at output Q of said flip-flop. Now, let us investigate the reset forming branch consisting of units 49, 50, 51, 52 and 53. By issuing a reset signal, this branch performs the resetting to reset position of counters 55 and 63 and R-S flip-flop 61.

Here, it should be pointed out as an essential element of the sampling method, how simply the equipment implementing the method is capable of accomplishing the recording according to the so-called absolute time. The lack of this ability has been discussed among the drawbacks of the Hinz equipment.

With switch 49 open, absolute times (according to a time scale measured from a starting point) are recorded, as the resetting of counters 55 and 63 accomplishing the time measurement takes place only after the "1" high level has appeared also at bit output 7 of 8-bit counter 63, which occurs after $2^7$ overflows of 16-bit counter 55, i.e. after the counters have already been operating for a time $T = 2^{23} t_o$ since the previous resetting to reset position. As bit output 7 of 8-bit counter 63 is linked up with one of the inputs of NOR gate 50, and the output of NOR gate 50 is led to the reset line through the three series—connected delayed-action inverters 51, 52, 53, the high "1" signal level producing the basic state and fed to the RESET inputs appears at the output of inverter 53 at time intervals of $T = 2^{23} t_o$. At these instants, 10000000 one-byte signals taken from the output of the 8-bit latch 64 will be recorded.

Thus, in the case of absolute time recording, the equipment operates each time a monitoring signal is intersected by the analog signal, the time values representing the value of samplings being recorded as if on a time scale graduated in units of absolute time. These absolute times are digitalized in the equipment by the time measurement performed by incessantly running counters 55 and 63, the contents of the latter counter, indicating the running time values, being simply read out through latches 57 and 64 at each instant a sample is taken.

With switch 49 closed, the equipment performs so-called relative-time recordings, where with the sample value the numerical values indicate the time that has elapsed since the last sampling (i.e. since the previous intersection of a monitoring level).

This is achieved so that each time a monitoring level is intersected by the analog signal, the positive "1" pulse reaching the output of OR gate 47, beside triggering the formation of the sample value (reading the time) always passes through closed switch 49 to one of the inputs of NOR gate 50, under the effect of which a positive "1" level will appear at the output of inverter 53, and pulse counters 55 and 63 as well as R-S flip-flop 61 are brought to their next state by triggering their reset inputs to the high "1" state. Inverters 51 and 52 have simply the role of synchronizing and delaying the signal so that at reset inputs (marked R) of counters 55 and 63 and of R-S flip-flop 61 the high "1" level will appear just at the instant when the latch units are already frozen. This is necessary so as not to erase the contents of counters 55 and 63 before having read them out.

It should be noted here how sharply the differences between the sampling method of the present invention and that proposed by Hinz manifest themselves. The equipment based on the principle of the present invention is capable of accomplishing the task of both relative time and absolute time recording, by simply changing the position of a switch as shown thereby eliminating drawback No. 5 of the Hinz equipment of not being able to perform recording of absolute time.

(2) The second possible mode of operation of pulse transmitter and time forming unit 3 is when 16-bit counter 55 has already overflown at least once, but the overflows have not yet reached $2^7$ in number.

As described above, the number of overflows of 16-bit counter 58 is indicated by the actual contents of 8-bit counter 63 through the interposed transmission forming chain consisting of eight-input NAND gates 58 and 59 and two-input NOR gate 60. The condition when the 16-bit counter 55 has already overflown at least once is indicated by the high "1" level at output Q of R-S flip-flop 61. Output Q of R-S flip-flop 61 being linked up with the highest value bit input 7 of 8-bit latch 64, a high "1" level can always be read out from bit output 7 of 8-bit latch 64, if at least one overflow has already occurred at 16-bit counter 55. Setting of the first, so-called control bit, to high level "1" is thus accomplished, since the 1-byte data words are read from the output of 8-bit latch 64. The value "1" of the first bit of the data word means that at least one overflow has already occurred on 16-bit counter 55, and that on the further seven bits of the 1-byte data word the binary number of overflows will appear, except for the case when all seven bits are 0, because in that case, the number of overflows having occurred in just $2^7$.

On the lower seven bit outputs (marked 0, 1, ... 6) of 8-bit latch 64 the number of overflows of 16-bit counter 55 truly appears, since bit inputs 0, 1, 2, 3, 4, 5, 6 of 8-bit latch 64 are connected to the identically numbered (0, 1, 2, 3, 4, 5, 6) outputs of 8-bit counter 63, and just the overflows occurring on 16-bit counter 55 are indicated in binary form by 8-bit counter 63. The only factor yet to be considered is that if an intersection of a monitoring level takes place when 16-bit counter 55 has already overflown at least once, but fewer than $2^7$ times, then, simultaneously, at output Q of R-S flip-flop 56 and also at output Q of R-S flip-flop 65 the high "1" level permitting the gating will appear. When this happens, then high "1" level will also be applied to input HLDR of 8-bit latch 64 and also to the HLDR inputs of latches 45 and 57. Latch 64 will now retain that 1-byte data word indicating the overflows, which is accessible to single-channel sample forming and recording unit 5 via bus h-j. The code of the monitoring level and residual time (that has elapsed since the last overflow) may be stored in the 3-byte data word, the bytes of which can be "read out'—as explained above—from the outputs of 8-bit latch 45 and 16-bit latch 57, respectively.

It will thus be clear that high "1" level will appear at outputs Q of both R-S flip-flops 56 and 65, if the intersection of a monitoring level by the analog signal occurs when 16-bit counter 55 has overflown at least once.

As shown, whenever a monitoring level is intersected, a positive pulse appears at the output of eight-input NAND gate 46, and this positive pulse, passing through OR gate 47 and reaching input S of R-S flip-flop 56, will also reliably trigger output Q of R-S flip-flop to high "1" level in this case.

From the output of NAND gate 46, however, the positive "1" pulse will also pass to one of the inputs of AND gate 48 and, as at the other input of AND gate 48 there has been a high "1" level present since the 16-bit counter 55 first overflowed (this high "1" level having been received from output Q of R-S flip-flop 61), the signal level will also be high "1" at the output of AND gate 48. This high "1" level signal appearing at the output of AND gate 48 is passed to one of the inputs of OR gate 62, so that the high "1" level appears also at the output of OR gate 62. The output of OR gate 62, however, is connected to the input S of R-S flip-flop 65, and consequently, under the effect of the high "1" level signal reaching the S input of R-S flip-flop 65, output Q of R-S flip-flop 65 will also be brought to high "1" level. Thus, both latch 57 and latch 64 will retain the actual contents of 16-bit counter 55 and 8-bit counter 63. Output Q of R-S flip-flop 65 is connected through bus h-j also to "data is arriving" input 2 of interrupt controller unit 66, so that a "write enable" high "1" level signal arrives simultaneously from output Q of R-S flip-flop 56 to input 1 of interrupt controller unit 66 and from output of R-S flip-flop 65 to input 2 of said interrupt controller unit 66. Of the two "data is arriving" inputs of the interrupt controller 66 input 2 is the one of higher priority, so that the 1-byte data word from the output of 8-bit latch 64 is recorded first, followed by recording of the 8-byte data word issued by the outputs of 8-bit latch 45 and 16-bit latch 57. After reading the 1-byte data word a "data acknowledging" high "1" signal level is led through bus h-j to input R of R-S flip-flop 65, under the effect of which a low "0" level signal appears at output Q of R-S flip-flop 65, bringing 8-bit latch unit 64 to its normal state. The 8-bit latch 45 and the 16-bit latch 57 are also brought in this case to their normal state (in a way described above) by the low "0" level present at output Q of R-S flip-flop 56, and appearing there under the effect of the positive "1" level signal arriving at input R of R-S flip-flop 56 from acknowledging output 1 of interrupt controller unit 66.

(3) Concerning operation of pulse transmitter and time forming unit 3, now only one case remains to be investigated, i.e. when $2^7$ overflows have occured at 16-bit counter 55.

In this case the 1-byte data word 10000000 has to be read from the output of 8-bit latch 64 while from the output of 8-bit latch 45 and from the output of 16-bit latch 57 forming the 3-byte data word no data transmission is taking place toward single-channel sample value forming and recording unit 5.

It is very easy to see that, in this case, on the eight-bit outputs of 8-bit latch 64 the level combination 10000000 corresponding to the 1-byte data word appears, as the first seven bit outputs of 8-bit pulse counter 64 are connected to the first seven bit inputs of 8-bit latch 64 (0, 1, ... 6), and since the number of overflows occurring at 16-bit pulse counter 55 are in binary form by pulse counter 63, the $2^7$ overflows thus having the result that the first seven bit outputs of 8-bit pulse counter 63 will reliably reset to zero. On the other hand, the high "1" level signal has already arrived at input 7 of 8-bit latch 64 from output Q of R-S flip-flop 61, overflows having already occurred in 16-bit counter 55. The fact that 8-bit latch 64 will truly retain at its output the information present at its input is also easy to see, because from output Q of R-S flip-flop 65 a high "1" level signal arrives at output HLDR of 8-bit latch 64. This comes about because when $2^7$ overflows of 16-bit counter 55 have occurred, a high "1" signal appears at the highest bit output 7 of 8-bit counter 63, and this high "1" level signal, appearing in turn at one of the inputs of OR gate 62, will also appear in turn at the output of OR gate 62. From here, this high "1" level signal arriving at input S of R-S flip-flop 65, will reliably trigger output Q of R-S flip-flop 65.

Reading out and acknowledging of the 1-byte data word issued from 8-bit latch 64 take place as described above.

Moreover, it is also true that during this period no data transmission occurs from 8-bit latch 45 and 16-bit latch 57, since output Q of R-S flip-flop 56 remains at low "0" level throughout.

This condition is satisfied, since during this period no intersection of monitoring levels by the analog signal takes place, and thus only a low "0" level signal can pass from the output of NAND gate 46 through OR gate 47 to intput S of R-S flip-flop 56.

The 16-bit counter 55 having overflown $2^7$-times, the system resets again, the high "1" level signal appearing at bit output 7 of 8-bit counter 63 will pass through NOR gate 50 and inverters 51, 52, 53 to the reset inputs of 16-bit counter 55, 8-bit counter 63 and R-S flip-flop 61.

Composition and storage of the 1-byte and 3-byte data words containing the result of sampling are carried out by single-channel sample value forming and recording unit 5, a possible construction of which is shown in FIG. 11. Single-channel sample value forming and recording unit 5 incorporates interrupt controller 66, $3 \times 8$-bit peripheral interface adapter 67 (possible type: I 8155), 8-bit peripheral interface adapter 68, common bus 69, microprocessor 70 (possible type: I8085), ROM memory unit 71 and RAM memory unit 72. In the h-j bus, output Q of R-S flip-flop 56 is connected to the "data is arriving" input 1 of interrupt controller 66, output Q of R-S flip-flop 65 is connected to input 2 of interrupt controller 66, the "data acknowledgment" output 1 of interrupt controller 66 is connected to input R of R-S flip-flop 56, and output 2 of interrupt controller unit 66 is connected to input R of R-S flip-flop 65. Further, joined on bus h-j, the eight parallel bit-outputs of 8-bit latch 64 are connected to the eight bit-inputs of peripheral interface adapter 68, and the sixteen parallel bit-outputs of 16-bit latch 57 are connected to the second and third byte inputs of $3 \times 8$-bit peripheral interface adapter 67. In the h-j bus, the line leading to input 1 of interrupt controller is linked up through bus i-k with input HLDR of 8-bit latch 45 as well. Joined on bus i-k, tee eight parallel bit-outputs of 8-bit latch 45 are linked up with the first byte-input of $3 \times 8$-bit peripheral interface adapters 67. Interrupt controller unit 66 and peripheral interface adapters 67 and 68 are connected to common bus 69. Joined to the same common bus 69 are microprocessor 70, ROM unit 71 and RAM unit 72. the data accept and acknowledgment functions of interrupt controller unit 66 has already been described in detail above. Data reading, recording and storage are controlled through common bus 69 by microprocessor 70 according to the program stored in ROM memory unit 71. Composition of the 1-byte data word is performed by 8-bit peripheral interface adapter 68, while that of the 8-byte data word is performed by $3 \times 8$-bit peripheral interface adapter 67. Data words coming from the outputs of peripheral interface adapters 67 and 68 are stored in RAM memory unit 72 under the control of microprocessor 70, with 8-bit peripheral interface adapter 68 having the highest priority.

The series-processing type equipment shown in FIG. 3 does not provide true-to-shape sampling of signals containing sections of infinitely high frequency (jump functions), because the interval between two adjacent intersections of a monitoring level with the analog signal cannot be shorter than the propagation time of coder 44 and latch 45. Though this is a very short time, it still defines an upper limiting frequency, requiring filtering of the analog signal by means of a high-stop filter dimensioned to said frequency.

The above deficiency can be eliminated by the parallel-processing setup shown in FIG. 4, which permits a truly frequency-independent sampling, i.e. true-to-shape sampling of signal sections of infinitely high frequency such as from a step function. This is of utmost practical importance, since it offers the possibility of solving the problem of obtaining readings with zero time intervals, i.e. when several events occur simultaneously, and still these events have to be identified.

Here, the principle of sampling consists of monitoring each level separately and of storing in the memory unit pertaining to each monitoring level only those (absolute or relative) time data, pertaining to the instant when a given level has been intersected by the input signal.

There will thus be no need to store the codes of the monitoring levels, and a considerable amount of storage capacity can be thereby dispensed with. Restoration of the analog signal from the sampled data can take place by means of independent (separate) playback, and when the samplings pertaining to each monitoring level have been played back, the sampled shape of the complete analog signal is restored.

It can thus be seen that the parallel-processing equipment shown in FIG. 4 is more universal than that of FIG. 3, but this versatility is achieved at the expense of a much higher number of component parts. This is the reason why the equipment of FIG. 3 has been most developed in practice, because in the case where samples from only relatively slowly changing signals have to be taken, there is no need to obtain true-to-shape samples from signals of infinitely high frequency (of infinite rate of rise), such as step functions, and the aim can be achieved by means of the series-processing equipment, the demand in components of this latter type being much lower.

In cases where true-to-shape sampling of very high frequency signal sections is also required, this aim can be achieved only with the so-called parallel-processing equipment.

For the sake of comparison, this kind of equipment is also shown as a five-channel design (establishing five monitoring levels).

The equipment illustrated in FIG. 4 comprises monitoring unit 1, range changing unit 7-8, as many pulse transmitter and time forming units 3 as there are monitoring levels to be covered (five in the present case), as well as multi-channel sample forming and reading unit 5'.

The setup and arrangement of level monitor 1 and positive/negative range changing unit 7-8 are the same as those of the series-processing equipment of FIG. 3 already described. The connections between the various units and their functions have already been described with reference to FIGS. 3, 7 and 8, so these will not be dealt with again here.

With this equipment, the outputs of comparator units 2 of level monitor 1 are branched in parallel and connected to the inputs of as many pulse transmitter and time forming units 3 as required by comparator units 2 corresponding to the number of monitoring levels. Output "a" of level monitor 1 is thus connected to the input of pulse transmitter and time forming unit 3/1, output "b" is connected to the input of pulse transmitter and time forming unit 3/2, output "c" is connected to the input of pulse transmitter and time forming unit 3/3, output "d" is connected to the input of pulse transmitter and time forming unit ¾, and output "e" is connected to the input of pulse transmitter and time forming unit 3/5.

In this way, the times of intersections of the analog signal with a given monitoring level are determined and digitalized by its corresponding pulse transmitter and time forming unit 3.

The outputs of pulse transmitter and time forming units 3/1, ... 3/5 are connected through buses (a'), (b'), (c'), (d'), (e') to the inputs of multi-channel sample forming and recording unit 5'.

Pulse transmitter and time forming units 3/1, 3/2, 3/3, ¾ and 3/5 are identical setups, so their circuit arrangement and operation will be described with reference to only one such unit.

An advantageous construction for each said unit may be that shown in FIG. 10 and discussed above, except that only a single inverter 46' is used instead of eight-input NAND gate 46. This is shown in FIG. 10 where the input of unit 3/2 is an inverter (46') enclosed by dotted lines, instead of NAND gate 46.

Thus, when the monitoring level pertaining to comparator unit 2/2 is intersected by the analog signal, a negative "0" pulse appears at output "b" of comparator unit 2/2 and is fed to the input of inverter 46'. At the output of inverter 46' a positive pulse appears in the same way as it appeared at the output of NAND gate 46 in the case of the series-processing variant described above, this positive pulse then passing from the output of inverter 46' to one of the inputs of OR gate 47 and also to one of the inputs of AND gate 48. From here on, the circuit arrangement and operation of each pulse transmitter and time forming unit 3 is the same as that described for the series-processing type of equipment illustrated in FIG. 3, so that description will not be repeated here.

There is an essential difference in the present embodiment, in the structure of the data word compiled by multi-channel sample value forming and recording unit 5'.

Coding of the sampled value becomes simpler here, since there is no need to form and record the code of the monitoring level, and only the final time value measured by 16-bit counter 55 and the contents of 8-bit counter 63 indicating the overflows of the 16-bit counter are considered.

In the same way as described above, 1-byte and 3-byte words are formed, the first bit of which is a control bit. The function of this control bit is as follows:

If the value of the control bit is "1", this indicates that the 16-bit counter has overflowed at least once. If its value is "0", this means the 16-bit counter 55 has not yet overflowed, and the time code is stored at the second and third byte of the 3-byte data word.

Here, the first byte of the 3-byte data word contains the number of overflows of 16-bit counter 55, and its second and third bits contain the numerical value of the time determined by 16-bit counter 55.

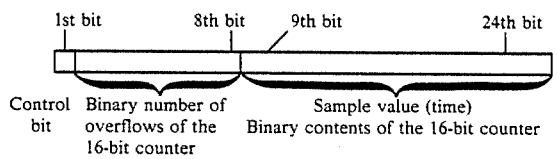

Control bit | Binary number of overflows of the 16-bit counter | Sample value (time) Binary contents of the 16-bit counter Let us see now what words are generated in the three states outline earlier.

(1) No overflow has yet occurred at the 16-bit counter. For example, at the 2nd monitoring level (gate unit 2/2) a level intersection takes place 257 $t_o$ after starting.

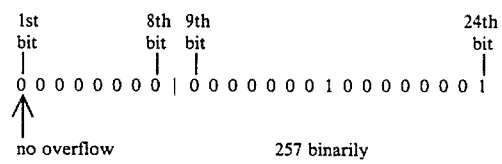

no overflow          257 binarily (2) The 16-bit counter has already overflowed once, but the number of overflows has not yet reached $2^7$. For example, sampling occurs when the 16-bit counter has overflown three times already, and a period of 15 $t_o$ has elapsed after the last overflow.

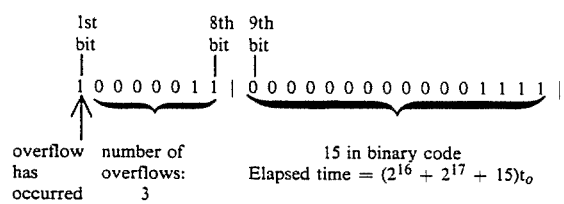

overflow has occurred | number of overflows: 3 | 15 in binary code  Elapsed time = $(2^{16} + 2^{17} + 15)t_o$ (3) At the 16-bit counter the number of occurred overflows has reached $2^7$. The time elapsed is just $T = 2^{23}t_o$, which is expressed by a 1-byte word, containing only "0" bits attached to the control bit of value "1".

It can be seen that in the equipment of the parallel-processing type only a single 1-byte data word of concrete form is formed to indicate $2^7$ overflows of the 16-bit counter.

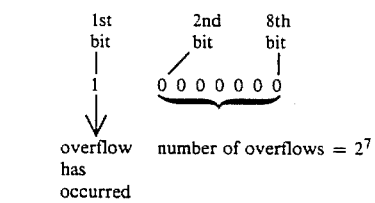

overflow has occurred    number of overflows = $2^7$

The 2nd and 3rd bytes of the 3-byte data words can also be read here from the outputs of 16-bit latch 57, and the 1-byte data word from the outputs of 8-bit latch 64.

The only difference from the equipment of the series-processing type is that in this case the first byte of the 3-byte data words is also read from the output of latch 64, because there is no need to record the code of the monitoring level.

Figure 12:
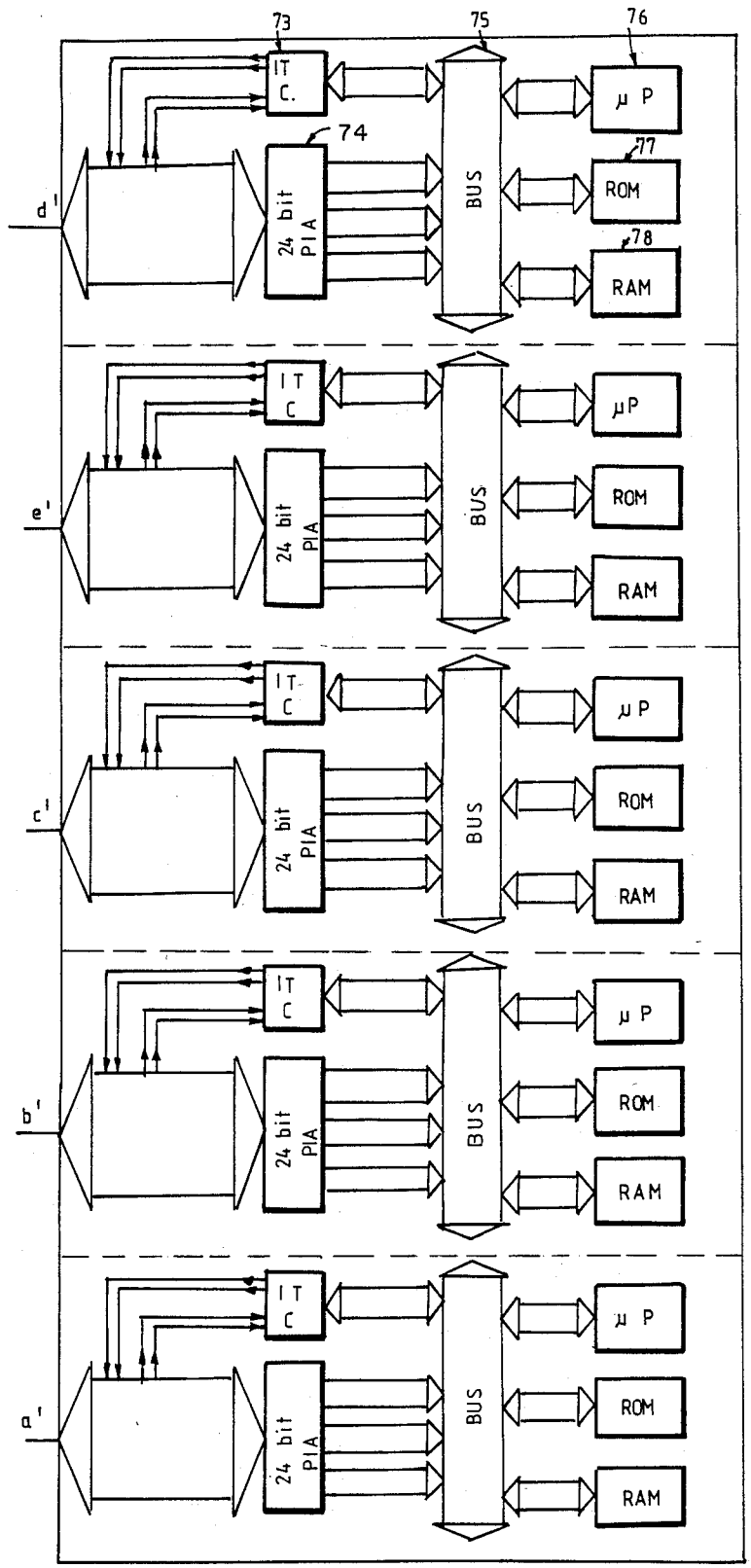
FIG. 12 is the circuit arrangement of the multi-channel sample value forming and recording unit.
Figure 14A:
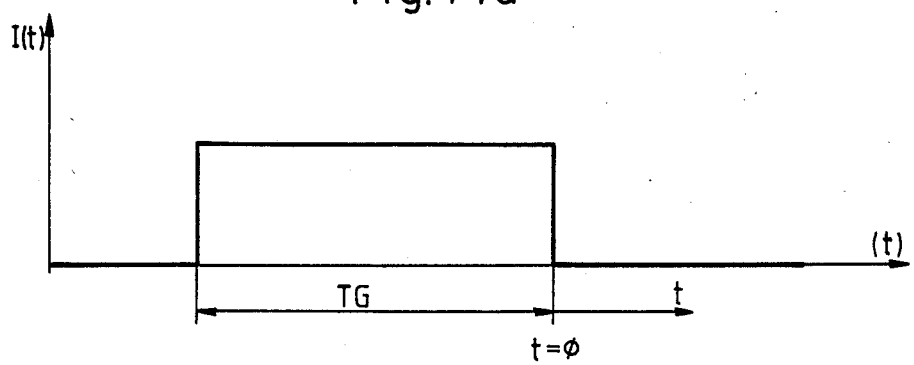
FIGS. 14a and b are the current and voltage functions of the IP system.
Figure 14B:
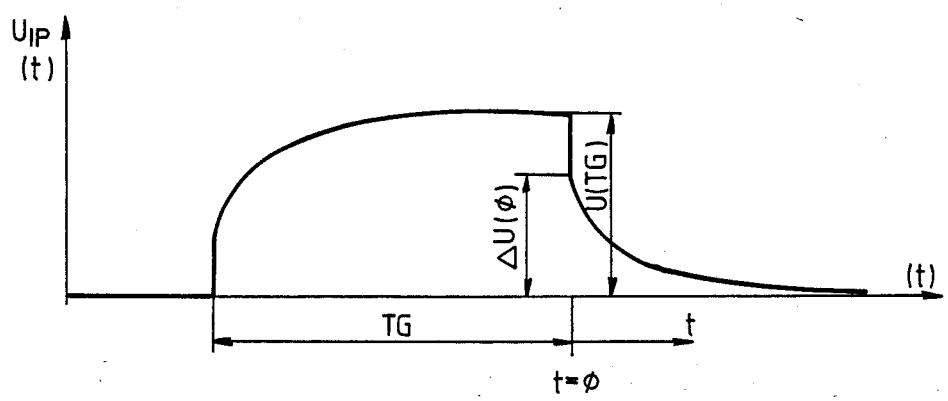

The compilation and recording of data words is performed by multi-channel sample value forming and recording unit 5', an advantageous embodiment of which is shown in FIG. 12.

The outputs of pulse transmitter and time forming units 3 are connected in parallel to busses (a'), (b'), (c'), (d'), (e') and to each bus a compiler and memory unit of identical design is attached. The buses are thus connected to interrupt controller units 73 and to 3×8-bit peripheral interface adapters 74. Interrupt controller units 73 and 3×8-bit periphery interface adapters 74 are connected to internal buses 75. Also to these internal buses 75 are connected microprocessors 76, ROM memories 77 and RAM memories 78.

The operation of each channel forming the multi-channel sample value forming and recording unit 5' corresponds, on the whole, to that of the single-channel sample value forming and recording unit 5 described with reference to FIG. 11, with the difference that here, in addition to the compilation of the 3-byte data words, the 3×8-bit peripheral interface adapters 73 also perform the compilation of the 1-byte (10000000) data word in their first 8-bit unit. Compilation and storage are controlled by microprocessors 76 with the help of the program stored in ROM-s 77. Similarly, microprocessors 76 perform—through interrupt controller units 73—the task of reading the data arriving from pulse transmitter and time forming units 3, as well as the storing of data words in RAM memories 78.

It should be noted here that the equipment of the parallel-processing type can, of course, be built so that a single common clock and common counter are used by pulse transmitters and time forming units 3/1, 3/2, . . . 3/5 and only for reading out the counters and for their gating by the latches are as many lines provided as the number of monitoring levels in question. Moreover, the multi-channel sample value forming and recording unit 5' can be built with a single common microprocessor and ROM unit.

Also different means for recording data words may be used (such as magnetic tapes).

The arrangements illustrated above in FIGS. 3 and 4 are also suitable for being integrated in chips put on the market as monolithic or hybrid integrated circuits (IC's).

Correspondingly, an A/D converter IC equivalent to the setup shown in FIG. 3 realizing series processing dynamic sampling, and another A/D converter IC equivalent to the setup shown in FIG. 4 realizing parallel-processing dynamic sampling, could be provided.

These circuits operate so that they transform the analog signal arriving at their inputs into digitally sampled form, thus permitting reading at their outputs the binary value of the absolute or relative time of intersections between the analog signal and monitoring levels in the case of setups built according to FIG. 4, whereas in the case of equipment as shown in FIG. 3, the binary code of the monitoring levels may be read as well.

The A/D converter IC corresponding to the arrangement shown in FIG. 3 can be economically built to contain level monitor 1, range changing unit 7-8 and pulse transmitter and time forming unit 3 but advantageously not to include clock 54.

It should be noted that the setup can, of course, comprise clock 54 as well, but the application of an integrated circuit is rendered more universal if an external clock is used for its control, permitting the generation of different time units $t_o$.

In this case, the inputs of the integrated circuit will be provided by the analog signal input and by the output of clock 54, whereas its outputs will be the outputs of pulse transmitter and time forming unit 3 connected to bus h-j and those of channel number adjusting unit 4 connected to bus i-k.

The A/D integrated circuit corresponding to the parallel-processing equipment illustrated in FIG. 4 incorporates level monitor 1, range changing unit 7-8 and pulse transmitter and time forming units 3/1, 3/2, 3/3, ¾, 3/5 advantageously without clock 54.

The inputs of the IC are constituted also here by the analog signal input and clock output, while the remaining terminals correspond to the bus lines of pulse transmitter and time forming units 3.

Figure 5A:
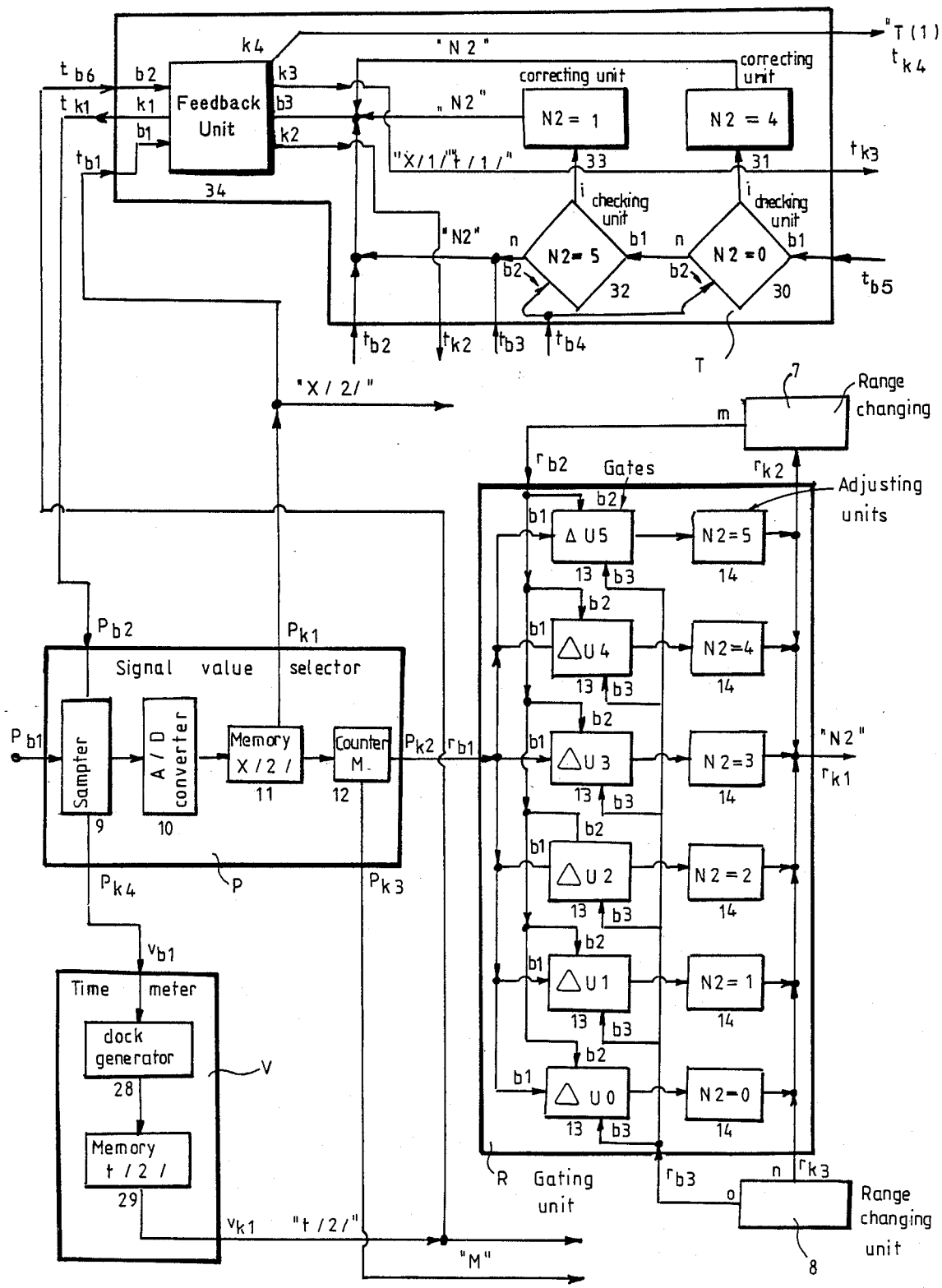

The circuitry of FIGS. 5a and 5b shows a possible embodiment comprising digital logic circuits and also comprising 5 channels. The number of channels is arbitrary in this case as well.

To the first input $P_{b1}$ of signal value selector P the signal to be recorded is connected, to its second input $P_{b2}$ the first output $t_{K1}$ of feedback and correction unit T is attached, whereas the first output $P_{k1}$ of signal value selector P is linked up with the first inputs $t_{b1}$ and $s_{b1}$ of feedback and correcting unit T and sample value forming and recording unit S, respectively.

The second output $P_{k2}$ of signal value selector P is connected to the first input $r_{b1}$ of gating unit R, the first output of $r_{k1}$ of gating unit R is connected to the seventh input $S_{b7}$ of sample value forming and recording unit S, the third output $P_{k3}$ of signal value selector P is connected to the fifth input $S_{b5}$ of sample value forming and recording unit S, the second output $s_{k2}$, third output $s_{k3}$, fourth output $s_{k4}$ and fifth output $s_{k5}$ of sample value forming and recording unit S are led to the correspondingly indexed second, third, fourth and fifth inputs $t_{b2}$, $t_{b3}$, $t_{b4}$ and $t_{b5}$ of feedback and correcting unit T, respectively, and the second, third and fourth outputs $t_{k2}$, $t_{k3}$, $t_{k4}$ of feedback and correcting unit T are linked up with the respective second, third and fourth inputs $s_{b2}$, $s_{b3}$ and $s_{b4}$ of sample value forming and recording unit S.

The fourth output $p_{k4}$ of signal value selector P can be linked up with input $V_{b1}$ of time meter V, output $v_{k1}$ of time meter V with the sixth input $s_{b6}$ of sample value forming and recording unit S and with the sixth input $t_{b6}$ of feedback and correcting unit T. Input 1 of positive-sense range hanging unit 7 can be connected to the second output $r_{k2}$ of gating unit R and its output m can be connected to the second input $r_{b2}$ of gating unit R, whereas input n of negative-sense range changing unit 8 is connected to the third output $r_{k3}$ of gating unit R and its output o is connected to the third input $r_{b3}$ of gating unit R.

Signal value selector P comprises sampler 9, analog-digital converter 10, memory 11 X(2) having first output $p_{k1}$, and counter 12 having second output $p_{k2}$ and third output $p_{k3}$.

In gating unit R gate circuits 13 and auxiliary channel number adjusting units 14 are connected in parallel series. The first inputs $b_1$ of gate circuits 13 are linked up with the first input $r_{b1}$ of gating unit R, its second inputs $b_2$ are fed from the second input $r_{b2}$ of R, while its third inputs $r_{d3}$ are supplied by the third input $r_{b3}$ of R. The output of the highest-value adjusting unit 14 of gating unit R is connected to the second output $r_{k2}$ of R and the output of the lowest value adjusting unit 14 is connected to the third output $r_{k3}$ of R.

In sample value forming and recording unit S the sampling number checking logic unit 15, the channel change sense checking unit 16, the auxiliary channel number adjusting unit 17 for positive channel changes, No. 1 Δ-value forming circuit 19, the channel number adjusting unit I 20, switch 24, time forming unit 25, channel number recorder 26, and data collector/recorder unit 27 are connected in series according to the following pattern:

$15_{b1}$, $15_{yes\ output}-16_{b1}$, $16_{>0\ output}-17-19_{b1}$,
$19_{k1}-20-24_{b1}$, $24_{k1}-25_{b1}$, $25_{output}-26_{b1}$,
$26_{output}-27$.

The <0 output of logic unit 16 for checking sense of channel change is linked up through unit 18 for adjusting ratio of auxiliary channel number with negative-sense channel changes with the second input $b_2$ to No. 1 Δ-value forming circuit 19, whereas this latter is connected by its second output $k_2$ to the input of unit 21 for checking multiple channel changes, the "yes" output of this latter is connected to the first input of No. 2 Δ-value forming circuit 22, the output of this latter is connected to the No. 2 channel number adjusting unit 23, the first output $K_1$ of No. 2 channel number adjusting unit 23 is connected to the second input $b_2$ of switch 24, whereas the second output $K_2$ and third output $K_3$ of switch 24 are led to the respective inputs of channel number recording unit 26.

The first input $s_{b1}$ of sample value forming and recording unit S is connected to the fifth input $b_5$ of No. 1 Δ-value forming unit 19 and to the second input $b_2$ of the logic unit 16 checking the sense of channel change; the third input $S_{b3}$ of S is connected to the fourth input $b_4$ of No. 1 Δ-value forming unit 19 and to the fourth input $b_4$ of No. 2 Δ-value forming unit 22; the fourth input $s_{b4}$ of S is connected to the second input $b_2$ of time forming unit 25; the fifth input $s_{b5}$ of S is connected to the logic unit 15 for sampling number checking; the sixth input $s_{b6}$ is connected to the third inputs $b_3$ of No. 1 Δ-value forming unit 19 and No. 2 Δ-value forming unit 22; and, finally, the seventh input $s_{b7}$ of S is connected to the first input $b_1$ of logic unit 15 serving for sample number checking.

To the second output $s_{k2}$ of sample value forming and recording unit S the "no" output of sample number checking logic unit 15 is connected, to its third output $s_{k3}$ is connected the "=0" output of logic unit 16 for channel change checking, to its fourth output $s_{k4}$ is connected the first output $k_1$ of this latter unit, to its fifth output $s_{k5}$ is connected the "no" output of multiple channel change checking unit 21 and the second output $k_2$ of No. 2 channel number adjusting unit 23.

In feedback and correcting unit T the first input $b_1$ of negative-sense range-change checking unit 30 is linked up with the fifth input $t_{b5}$ of feedback and correcting unit T, the "yes" output of unit 30 is connected to the input of No. 2 auxiliary channel number adjusting unit 31, the "no" output of unit 30 is connected to the first input $b_1$ of positive-sense range-change checking unit 32, and the second input $b_2$ of unit 30 is connected to the fourth input $t_{b4}$ of feedback and correcting unit T. The second input $b_2$ of positive-sense range-change checking unit 32 is linked up with the fourth input $t_{b4}$ of unit T, and the "yes" output of unit 32 is connected to the input of No. 2 auxiliary channel number correcting unit 33. The "no" output of unit 33 is connected to the third input $b_3$ of feedback unit 34. No. 1 auxiliary channel number correcting unit 31 and No. 2 auxiliary channel number correcting unit 33 are linked up through their outputs with the third input $b_3$ of feedback unit 34. The first input $b_1$, the first output $k_1$, second output $k_2$, third output $k_3$ and fourth output $k_4$ of feedback unit 34 are identical to the identically marked input and outputs of feedback and correcting unit T, whereas its second input $b_2$ is identical to that of the sixth input $t_{b6}$ of feedback and correcting unit T. The second input $t_{b2}$ and the third input $t_{b3}$ of feedback and correcting unit T are connected to the third input $b_3$ of feedback unit 34.

In time meter V, clock pulse generator 28 and memory 29 t(2), connected in series, are accommodated.

Figure 6:
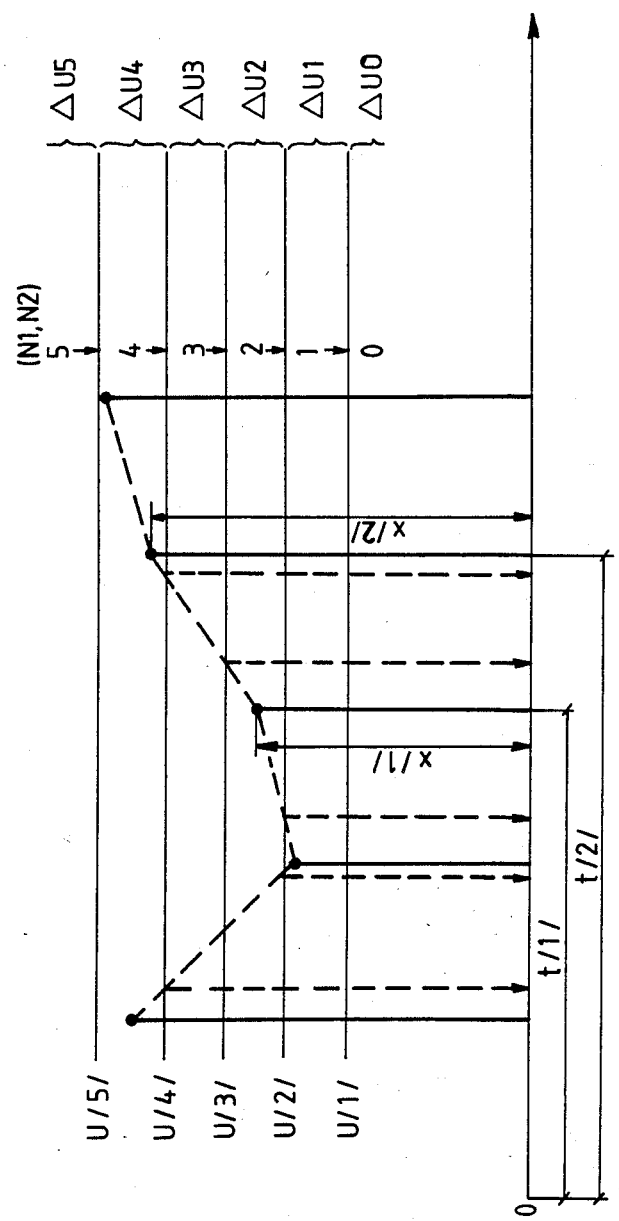
FIG. 6 shows the operating principle of the equipment of FIG. 5.

The principle of operation of the equipment defined by this circuit arrangement can be seen in FIG. 6.

The value of the analog signal is determined at discrete instants of time—always with the use of only two adjacent signal values—so that by utilizing the time data t(1) and t(2) pertaining to these instants, the sample values of dynamic sampling are determined by linear interpolation, i.e. those instants when the value found by interpolation is identical to the value of a monitoring level. Index 2 refers to the later value.

Instead of linear interpolation an interpolation according to any other function may also be used, but the accuracy provided by linear interpolation will be sufficient in most cases.

The ranges of signal values are divided by the monitoring levels into gates shown in FIG. 6.

$$\Delta U(0) < U(1)$$

$$U(i) \leq U(i)\ U(i+1)\ i=1, 2, \ldots, N-1$$

$$\Delta U(N) \geq U(N)\ N = \text{number of monitoring levels}.$$

Each discrete signal value obtains that auxiliary channel number N1, N2, ... corresponding to the gate which it falls into. If with two adjacent discrete signal values the difference between auxiliary channel numbers is larger than 2, then sample signals are formed only with the highest and lowest intersected monitoring levels, since no new information would be yielded by the data value of the levels between them.

When the difference between auxiliary channel numbers is 1 or 2, then 1 or 2 sample values are formed, respectively, and when the channel numbers are equal, no sample value is formed. After having determined the sample values, the discrete signal value X(1) and the time value t(l) can be discarded, and then the values $X(1)_{new}=X(2)$, and $t(1)_{new}=t(2)$, can be formed, respectively.

The above is accomplished by the equipment according to the circuit arrangement shown in FIGS. 5a and 5b, where the quantities flowing in the various data transmission channels are written between quotation marks, whereas the control and instruction signals are not specifically indicated.

The signal value selector unit P incorporates sampler 9, A/D converter 10, memory 11 X(2) and sampling counter 12.

Gating unit R contains gate circuits 13 and auxiliary channel number units 14 in a number depending on that of the monitoring units.

Sample value forming and recording unit S is built up of sampling number checking logic unit 15, channel change sense checking logic unit 16, auxiliary channel number ratio adjusting unit 17 for positive-sense channel change, auxiliary channel number ratio adjusting unit 18 for negative-sense channel change, No. 1 Δ-value forming unit 19, channel number adjusting unit 20, multiple channel change checking unit 21, No. 2 Δ-value forming unit 22, No. 2 channel number adjusting unit 23, switch 24, time forming unit 25, channel number recorder 25, and data collecting unit data recorder 27. Time meter V consists of series-connected clock generator 28 and memory 29 t(2). Feedback and correcting unit T is composed of negative-sense range change checking unit 30, No. 1 auxiliary channel number correcting unit 31, positive-sense range change checking unit 32, No. 2 auxiliary channel number correcting unit 33 and feedback unit 34.

From the signal a sample is taken by sampling unit 9 (hold circuit) at a discrete instant, and the value of this instant is fed by clock generator 28 to memory unit 29 t(2) (provided a time meter V is used). The discrete signal value "held" by sampling unit 9 is digitalized by A/D converter 10—in the way known from common practice—and is stored in memory 11 X(2), and the connected sampling counter being continuously filled, it indicates the number of discrete signal values received by sampling unit 9. The signal, then, passes to gate circuits 13, and the gate the value of the signal falls into, issues a control signal to auxiliary channel number adjusting unit 14 connected to it, whereby the auxiliary channel number is set to the corresponding value.

The negative-sense range changing unit 8 linked up with the lowest-value auxiliary channel number adjusting unit 14 and the positive-sense range changing unit 7 linked up with the highest-value auxiliary channel number adjusting unit 14 will displace—in the way already described—the range of monitoring levels in the required direction by modifying their value so as to make them cover the signal. Now, the sample number checking logic unit 15 determines how many discrete signal value determinations (M) have taken place. If this number is only one, then the process is directed to feedback unit 34. Parameters t(1); X(1); N1 required for the determination of the dynamic sample values will now be stepped and stored by feedback unit 34 in the following way:

t(1) = t(2)

X(1) = X(2)

N1 = N2 and sampling unit 9 will be permitted to take a new sample. After at least two discrete signal values have been determined, the process is transferred from sample number checking logic unit 15 to channel change sense checking logic unit 16. When no change of the auxiliary channel number occurs, feedback unit 34 steps into action, and no sampling will take place. If a rising signal is found, the process is led to unit 17 adjusting the ratio of the auxiliary channel number for a positive-sense changing of the channel, whereas in the case of a declining signal unit 18 adjusting the auxiliary channel number ratio for a negative-sense channel change will be activated.

Unit 17 adjusting the ratio of auxiliary channel number for a positive-sense channel change and unit 18 adjusting the ratio of auxiliary channel number for a negative-sense channel change make auxiliary channel numbers N2 and N1 correspond to the higher "NN" and to the lower "NK" auxiliary parameters. Now, No. 1 Δ-value forming unit 19, performing the mathematical operation shown below, finds the value $\Delta t_1$, valid for the intersected lowest monitoring level, where $\Delta t_1$ is the period of time elapsing from t(1) until the instant at which the signal passes across the intersected lowest-value monitoring level.

In the case of linear interpolation:

$$\Delta t_1 = \frac{U(NK+1) - x(1)}{x(2) - x(1)} \cdot [t(2) - t(1)].$$

No. 1 channel number adjusting unit 20 now takes the actual channel equal to NK+1. Simultaneously, multiple channel change checking unit 21 identifies whether only one monitoring level has been intersected by the signal. If yes, there is no need to perform further sample value formings, and control is transferred through the feedback branch to negative-sense range change checking unit 30. If, however, more than one monitoring level has been intersected by the signal (NN−NK>1), a sample value has to be performed also at the highest value intersected monitoring level, so No. 2 Δ-value forming unit 22 will calculate the interval $\Delta t_2$ elapsing from t(1) up to the instant the signal passes across the highest-value intersected monitoring level.

With linear interpolation:

$$\Delta t_2 = \frac{U(NN) - X(1)}{X(2) - X(1)} \cdot [t(2) - t(1)].$$

On this branch the actual channel number is modified to NN by No. 2 channel number adjusting unit 23 linked up with No. 2 Δ-value forming unit 22. Form No. 1 channel number adjusting unit 20 and No. 2 channel number adjusting unit 23 the process is transferred to switch 24, which will always permit the passage of $\Delta t_1$ to the input "Δt" of time forming unit 25 whereas the passage of $\Delta t_2$ takes place only after the processing of $\Delta t_1$. The final sample value is formed by time forming unit 25 (in the case of absolute time recording in the form of t=t(1)=Δt).

Channel number recorder 26 performs coding of the actual channel number arriving from switch 24 and adds it, as sampling information, to the sample value "t" determined by time forming unit 25. The sampling information then passes into data collecting/data recording unit 27.

In the feedback branch are located the negative-sense range change checking unit 30 and the positive-sense range change checking unit 32, which may obtain their control from multiple channel change checking unit 21 and from No. 2 channel number adjusting unit 23, i.e. when sample value forming is taking place. Negative-sense range change checking unit 30, when N2=0, then detects the negative-sense range changing and sets No. 1 auxiliary channel number correcting unit 31 in operation, by which the auxiliary channel number N2 is set to "N−1", and this will be fed to feedback unit 34.

The control will be passed to the positive-sense range change checking unit 32, when there is no negative-sense range changing. Unit 32 checks whether N2 is equal to the maximum auxiliary channel number. In the case of equality, range changing is verified by No. 2 auxiliary channel number correcting unit 33, it makes N2 equal to 1 and switches to feedback unit 34. When there is no range changing, the auxiliary channel numbers pass uncorrected to feedback unit 34 which will again issue a command to sampling unit 9 in the described way, so the control and processing action will take place continuously. The times of positive-sense changes of value ranges are issued by the samples of highest channel numbers, whereas the negative-sense range changes will be assigned by samples of channel number 1. So there is no need to make separate records of the range changes.

The equipment illustrated in FIGS. 5a and 5b may also be built up in such a way that sampling unit 9 will always operate at preset constant periods, i.e. the control is not aimed at taking discrete signal values. In this case clock generator 28 and t(2) memory 29 become unnecessary, feedback unit 34 does not need to be stepped by t(1), or store that period and issue commands to repeat sampling, and the arithmetic functions to be performed by No. 1 and 2 Δ-value forming units 19 and 22 and by time forming unit 25 will be simpler.

What is claimed is:

1. Method of real time sampling a signal, comprising: supplying an input signal;
establishing a desired signal value range comprising a plurality of differently valued monitoring levels within said desired signal value range;
simultaneously comparing said input signal with each of said plurality of monitoring levels;
detecting every time at which said input signal has a value equal to that of a said monitoring level; and
recording an independent time variable representative of each said detection of said input signal value equal to that of a said monitoring level.

2. A method of sampling a signal, comprising the steps of
 (a) supplying an input signal;
 (b) establishing a desired signal value range including an initial lowest-value monitoring level and an initial highest-value monitoring level and a plurality of differently valued monitoring levels therebetween;
 (c) simultaneously comparing said input signal with each of said plurality of monitoring levels;
 (d) detecting every time at which said input signal has a value equal to that of a said monitoring level;
 (e) recording an independent time variable representative of each said detection of said input signal value equal to that of a said monitoring level; and
 (f) increasing the value of each of said plurality of monitoring levels each time said input signal has a value greater than said initial highest-value monitoring level and decreasing the value of each of said plurality of monitoring levels each time said input signal has a value less than said initial lowest-value monitoring level.

3. Apparatus for real time sampling a signal, comprising:
means for receiving an input signal;
means for establishing a desired signal value range comprising a plurality of differently valued monitoring levels within said desired signal value range;
means for simultaneously comparing said input signal with each of said plurality of monitoring levels;
means for detecting every time at which said input signal has a value equal to that of a said monitoring level; and
means for recording an independent time variable representative of each said detection of said input signal value equal to that of a said monitoring level.

4. Apparatus for sampling a signal, comprising:
 (a) means for receiving an input signal;
 (b) means for establishing a desired signal value range including an initial lowest-value monitoring level, an initial highest-value monitoring level and a plurality of differently valued monitoring levels therebetween;
 (c) means for simultaneously comparing said input signal with each of said plurality of monitoring levels;
 (d) means for detecting every time at which said input signal has a value equal to that of a said monitoring level;
 (e) means for recording an independent time variable representative of each said detection of said input signal value equal to that of a said monitoring level; and
 (f) means for increasing the value of each of said plurality of monitoring levels each time said input signal has a value greater than said initial highest-value monitoring level and decreasing the value of each of said plurality of monitoring levels each time said input signal has a value less than said initial lowest-value monitoring level.

5. Apparatus according to claim 4 wherein said means for simultaneously comparing comprise a plurality of comparing units branched in parallel to said signal receiving means, each said comparing unit comprising a potentiometer for storing an adjustable reference voltage, and a comparator having a signal input connected to said signal receiving means and a reference input connected to its corresponding said potentiometer, each said potentiometer being connected to and acted on by said means for increasing the value of said monitoring levels and said means for decreasing the value of said monitoring levels.

6. Apparatus for sampling a signal, comprising:
 (a) means for receiving an input signal;
 (b) means for establishing a desired signal value range comprising a plurality of differently valued monitoring levels within said desired signal value range;
 (c) means for simultaneously comparing said input signal with each of said plurality of monitoring levels, said comparing means including a plurality of comparing units connected in parallel with said signal receiving means, each of said comparing units including an output;
 (d) means connected with the outputs of said comparing units for detecting every time at which said input signal has a value equal to that of a said monitoring level;
 (e) means connected with the outputs of said comparing units for recording an independent time variable representative of each said detection of said input signal value equal to that of a said monitoring level;
 (f) means connected with the outputs of said comparing units for generating a code representative of a said monitoring level corresponding to the value of which said input signal has just become equal; and
 (g) single channel means for storing and processing information received from said detecting and recording means and said code generating means.

7. Apparatus for sampling a signal, comprising;
 (a) means for receiving an input signal;
 (b) means for establishing a desired signal value range comprising a plurality of differently valued monitoring levels within said desired signal value range;
 (c) means for simultaneously comparing said input signal with each of aid plurality of monitoring levels, said comparing means including a plurality of comparing units connected in parallel with said signal receiving means, each of said comparing units including an output;

(d) a plurality of detecting means connected with the outputs of said plurality of comparing units, respectively, for detecting every time at which said input signal has a value equal to that of a said monitoring level, each of said detecting means having an output;

(e) a plurality of recording means connected with said plurality of comparing units, respectively, for recording an independent time variable representative of each said detection of said input signal value equal to that of a said monitoring level, each of said plurality of recording means having an output; and (f) multichannel means connected with said outputs of said detecting and recording means for storing and processing information received therefrom.

* * * * *